(12) United States Patent
Kosugi

(10) Patent No.: US 6,654,938 B2
(45) Date of Patent: Nov. 25, 2003

(54) DELAY CHARACTERISTIC ANALYZING METHOD AND DELAY CHARACTERISTIC ANALYZING SYSTEM FOR A CUSTOM LSI

(75) Inventor: Kazuyuki Kosugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 09/949,088

(22) Filed: Sep. 10, 2001

(65) Prior Publication Data

US 2002/0100006 A1 Jul. 25, 2002

(30) Foreign Application Priority Data

Jan. 24, 2001 (JP) ........................................ 2001-015819

(51) Int. Cl.[7] ............................................. G06F 17/50
(52) U.S. Cl. ................................... 716/6; 716/4; 716/5
(58) Field of Search ........................................ 716/1–14

(56) References Cited

U.S. PATENT DOCUMENTS

| | | | | |
|---|---|---|---|---|
| 4,645,944 A | * | 2/1987 | Uya | 327/410 |
| 4,744,084 A | * | 5/1988 | Beck et al. | 714/33 |
| 5,210,700 A | * | 5/1993 | Tom | 716/6 |
| 5,666,288 A | * | 9/1997 | Jones et al. | 716/17 |
| 6,223,333 B1 | * | 4/2001 | Kuribayashi et al. | 716/12 |

FOREIGN PATENT DOCUMENTS

| | | |
|---|---|---|
| JP | 7-114580 | 5/1995 |
| JP | 7-311791 | 11/1995 |

\* cited by examiner

*Primary Examiner*—Matthew Smith
*Assistant Examiner*—Sun James Lin
(74) *Attorney, Agent, or Firm*—Staas & Halsey LLP

(57) ABSTRACT

Circuit blocks each of which is within a predetermined scale are formed based on a read-out net list. Each circuit block is subjected to a dynamic timing analysis, and a delay characteristic library including obtained analysis results is generated. A static timing analysis is performed based on the delay characteristic library. In this manner, the transmission delay of a desired signal path is analyzed in such a manner that the circuit to be analyzed that is indicated by the net list is regarded to be constructed by the above circuit blocks. A delay characteristic analyzing method is provided that can shorten the processing time while maintaining a high degree of freedom of LSI designing and high accuracy of critical path determination in transistor-level full custom LSI designing.

19 Claims, 25 Drawing Sheets

(A)

(B)

(a)

CONNECTED

INPUT SLEW

|  | 0 | 0.1 | 0.2 | 0.3 | 0.4 |
|---|---|---|---|---|---|
| 20 | 0 | 35 | 50 | 60 | 65 |
| 50 | 0 | 45 | 80 | 85 | 90 |
| 100 | 0 | 65 | 90 | 92 | 95 |
| 150 | 0 | 70 | 100 | 103 | 105 |
| 200 | 0 | 75 | 105 | 110 | 112 |

(b)

(a)

(b)

DELAY CHARACTERISTIC ANALYZING METHOD AND DELAY CHARACTERISTIC ANALYZING SYSTEM FOR A CUSTOM LSI

BACKGROUND OF THE INVENTION

1. Field of the Invention

The present invention relates to a delay characteristic analyzing method for analyzing the delay characteristic of a custom LSI precisely in the EDA (electronic design automation) for custom LSIs that is used for elaborate designing on the transistor level.

To design a custom LSI that exhibits necessary performance reliably, a transistor-level design technology makes it possible to design a custom LSI by combining a wide variety of transistors freely is required.

To evaluate correctly whether a full custom LSI that has been designed elaborately on the transistor level exhibits necessary performance, a delay characteristic analyzing method for analyzing its delay characteristic very accurately and a delay characteristic analyzing system using such a delay characteristic analyzing method are indispensable.

2. Description of the Related Art

Among the paths connecting an input node and an output node of an LSI, paths along which a signal reaches the output node with a shortest delay time and a longest delay time are called critical paths, respectively. The critical paths and their delay times are part of the important indices that are used to judge whether a designed LSI exhibits intended performance and to identify portions where design modification is needed. The timing analysis methodology is used widely in the custom LSI designing to extract critical paths.

In fields where elaborate transistor-level designing is needed, the dynamic timing analysis using an electrical circuit simulation is performed on the entire net list that indicates a connection between transistors to estimate precisely a delay time of signal transmission along every conceivable path.

However, for LSIs having a large scale, the dynamic timing analysis that is performed on the entire net list is not a realistic method for the following reasons.

First, as the LSI scale increases and the number of input and output nodes increases accordingly, naturally the number of combinations of input signals (hereinafter referred to as "test vectors") to be prepared for an electrical circuit simulation increases. Second, as the number of output nodes of the LSI increases, the number of combinations of loads that are assumed as loads to be connected to the LSI increases. Third, as the number of transistors constituting the LSI increases, naturally the time that is taken to perform an electrical circuit simulation for each test vector becomes longer and hence an enormous amount of time becomes necessary as a whole to estimate delay times of all the necessary paths.

On the other hand, the static timing analysis can analyze a large-scale net list in a much shorter time than in the above-described dynamic timing analysis, by estimating the delay time in each path according to the delay characteristics of each unit of a circuit, called cell, and the relation between cells. For this reason, the static timing analysis has been used conventionally in such fields as designing of large-scale gate arrays.

However, for the following reasons, it is very difficult to use the static timing analysis itself as a timing analysis methodology for the transistor-level custom LSI designing.

First, to provide the degree of freedom that is necessary in the transistor-level custom LSI designing, it is necessary to construct a large-scale cell library in which a delay characteristic of each of an enormous number of kinds of transistors is registered.

Even if a cell library of such a large scale is prepared, the static timing analysis does not satisfy the accuracy as required in the transistor-level custom LSI designing as long as the static timing analysis employs a method in which the transistor is regarded as a linear resistance and an approximate delay time is determined using an RC product of the linear resistance and a load capacitance. Further, data that is registered in a cell library is just a delay characteristic that was determined in advance for a combination of several typical slew rates and output loads. Therefore, for an input slew rate and an output load that deviate from the above typical values, the accuracy of a delay characteristic obtained by the static timing analysis would be even lower.

Further, in the static timing analysis, a delay time of each path connecting an input node and an output node is estimated individually by accumulating delay times of respective cells on the path. Therefore, in principle, an obtained result does not reflect influences of traveling of signals along other paths on traveling of a signal along the subject path.

For example, consider a case of performing a delay analysis on paths from an input node Al to an output node X in a circuit that is represented by a logic circuit shown in FIG. 25. Delay time accumulation is performed indiscriminately even for cases where a signal is never transmitted actually along a path to be analyzed as in a case where truth values are inputted at both input nodes A2 and B2 or where a false value at the input node A2.

Therefore, even an invalid path along which no signal is transmitted actually is detected as a critical path when an obtained delay time is longest or shortest.

To prevent misidentifications such as an invalid path from being detected as a critical path, a method has been proposed in which critical path candidates are extracted based on delay times of respective paths obtained by the static timing analysis and an electrical circuit simulation is performed by generating test vectors for those paths.

However, determining a true critical path using the above method still requires much labor and processing time.

This is for the following reason. According to simple calculation, the number of test vectors that are necessary to determine a correct delay time for one critical path candidate is equal to the square of a number obtained by subtracting 1 from the number n of external input terminals, that is, $(n-1)^2$. In addition, as the number of stages of transistors along the path candidate increases, an electrical circuit simulation for each test vector comes to take longer time; the total processing time becomes very long. Naturally, the number of test vectors can be decreased by using an automatic test vector generation method. The advantage of the automatic test vector generation method may not be fully utilized in a case where the subject LSI has a complex circuit configuration containing many pass transistors and has many external input terminals.

In the conventional dynamic timing analysis, an electrical circuit simulation is performed on the entire circuit. And in the conventional static timing analysis, a subject of delay characteristic analysis is a path from an input terminal to an output terminal.

Therefore, whichever delay characteristic analyzing method is used, when the design of a custom LSI is modified, a dynamic timing analysis is performed on the entire circuit or a static timing analysis is performed on every conceivable path in the same manner as in the case of analyzing a new net list irrespective of the range where the modification has influence. It is impossible to quickly cope with a partial modification to a net list.

SUMMARY OF THE INVENTION

An object of the present invention is to provide a delay characteristic analyzing method capable of shortening the processing time while maintaining a high degree of freedom of LSI designing and high accuracy of critical path determination in transistor-level full custom LSI designing.

Another object of the invention is to provide a delay characteristic analyzing method that enables quick and precise delay characteristic analysis by utilizing a result of an analysis that was performed on a circuit before the change where there is partial modification of a net list (the circuit design or the conditions relating to signal transmission) in full custom LSI designing.

Another object of the invention is to obtain very quickly an analysis result with incomparably higher accuracy than a conventional, simple timing analysis by analyzing the dynamic delay characteristic of each circuit portion that are obtained by dividing a custom LSI including an enormous number of transistors into proper scales (hereinafter referred to as "circuit blocks") and then, by making use of the result of analysis, performing a static timing analysis on the custom LSI in such a manner as to regard it as a set of those circuit blocks.

Another object of the invention is to eliminate limitations on circuit elements included in each circuit block and thereby assure the degree of freedom of designing that is necessary for designing a full custom LSI.

Another object of the invention is to obtain a highly accurate electrical circuit simulation result by employing, in forming circuit blocks as subjects of electrical circuit simulation, conditions for combining that a circuit block should include a transistor that is connected to a power supply terminal or a ground terminal and that the number of circuit blocks having a node pair where an input signal varies simultaneously (hereinafter referred to as "simultaneous-varying inputted node pair") should be minimized.

Another object of the invention is to greatly increase the accuracy of an analysis result of a dynamic timing analysis on a circuit block having a simultaneous-varying inputted node pair.

Another object of the invention is to determine a dynamic delay characteristic of a circuit block to be analyzed precisely and quickly, considering influences by downstream circuit blocks when performing an electrical circuit simulation on an expanded circuit, which is the circuit block to be analyzed added a downstream circuit block.

Still another object of the invention is to quickly obtain a highly accurate electrical circuit simulation result in performing a dynamic timing analysis on each circuit block.

Yet another object of the invention is to flexibly cope with a case that, for example, when the use of invalid input signals is found in the test vector used in electrical circuit simulations in part of the circuit blocks after construction of a delay characteristic library of the net list that is already done, a static timing analysis using dynamic delay characteristics obtained by using a new test vector which has no invalid input signals can be quickly performed.

A further object of the invention is to delay-characteristic analyze a new net list with minimum processing by effectively using an enormous amount of data obtained by delay characteristic analysis on an old net list.

According to one aspect of the invention, a read-out net list is divided into unit cells, and circuit blocks each of which is within a predetermined scale are formed by coupling of unit cells to each other according to a predetermined condition by the block forming procedure. A dynamic timing analysis is performed on each circuit block. A delay characteristic library including obtained analysis results is generated and used in a static timing analysis. By this, the transmission delay of a desired signal path is analyzed by considering the circuit to be analyzed that is indicated by the net list to be a set of the above circuit blocks.

In the above delay characteristic analyzing method, since a static timing analysis is performed based on analysis results obtained by performing a dynamic timing analysis on each circuit block, the delay characteristic of a custom LSI can be analyzed in a much shorter time than in a case where the entire, undivided net list is subjected to an electrical circuit simulation.

According to another aspect of the invention, in forming circuit blocks by coupling unit cells together, conditions are employed that a circuit block should include a transistor that is connected to a power supply terminal or a ground terminal and that a unit cell that is a factor of causing a simultaneous-varying inputted node pair such as an inverter having a particular connection should be coupled to an immediately upstream or downstream circuit block.

According to the above circuit block forming procedure, reduction in accuracy that would be caused by performing an electrical circuit simulation while handling a circuit block as an independent circuit that is separated from the entire net list can be prevented. Further, removing simultaneous-varying inputted node pairs makes it possible to obtain a correct result of an electrical circuit simulation.

According to another aspect of the invention, in forming circuit blocks by coupling unit cells together, an inverter block that is connected to an external output terminal is made a single, independent circuit block.

With this circuit block forming procedure, a problem unique to an electrical circuit simulation on a circuit block that is connected to an external output terminal can be solved, that is, increase in the number of simulations that would otherwise be caused by the necessity of performing simulations by assuming plural kinds of output loads can be prevented, whereby the time necessary for the electrical circuit simulation can be shortened.

According to another aspect of the invention, in a dynamic timing analyzing procedure, in a case where circuit blocks are selected as subjects to be analyzed in order from the circuit block closest to an external input terminal and a circuit block concerned has a simultaneous-varying inputted node pair, its phase difference is estimated by performing a static timing analysis, a test vector that reflects the estimated value is generated, and the generated test vector is applied to an electrical circuit simulation.

In this dynamic timing analyzing procedure, a phase difference that occurs when each input signal reaches simultaneous-varying inputted node pair is estimated with very high accuracy and an electrical circuit simulation on the circuit block concerned is performed by using the estimated value. Therefore, a highly accurate analysis result can be obtained even for a circuit block having a simultaneous-varying inputted node pair.

According to another aspect of the invention, in a dynamic timing analyzing procedure, an average value or an expected value of a phase difference obtained by a statistical method or a value that is input by a user is used in an electrical circuit simulation as a phase difference that occurs when each input signal reaches simultaneous-varying inputted nodes.

This dynamic timing analyzing procedure makes it possible to make much shorter the time necessary for preprocessing of an electrical circuit simulation than in a case of using an estimated value obtained by a static timing analysis.

According to another aspect of the invention, in a dynamic timing analyzing procedure, prior to an electrical circuit simulation on each circuit block, a maximum loading simulation vector and a minimum loading simulation vector are determined for each of downstream circuit blocks that are connected to the circuit block concerned. When an electrical circuit simulation is performed on an expanded circuit including the circuit block to be analyzed and its downstream circuit blocks, the maximum loading simulation vectors or minimum loading simulation vectors are applied to the respective downstream circuit blocks.

This dynamic timing analyzing procedure makes it possible to quickly determine a delay characteristic of a circuit block to be analyzed while taking into account influences of downstream circuit blocks connected to it.

According to still another aspect of the invention, in a dynamic timing analyzing procedure, an electrical circuit simulation is performed on a circuit block to be analyzed in which the circuit blocks to be analyzed are selected in order from the circuit block closest to an external input terminal and approximated waveforms obtained by dynamic timing analyses on upstream circuit blocks are used as input signal waveforms to perform circuit simulation on the circuit block to be analyzed. Approximated waveforms that reflect features of output signals of the circuit block to be analyzed are generated and used for an electrical circuit simulation on a downstream circuit block.

In this dynamic timing analyzing procedure, dynamic timing analyses on respective circuit blocks can be performed under conditions that provides an environment that is very close to an environment that each circuit block is connected to upstream circuit blocks, though the dynamic timing analyses are independent from each other. Therefore, a highly accurate analysis result can be obtained for each circuit block.

According to a yet another aspect of the invention, in a delay characteristic analyzing method, after a delay characteristic library is generated, an electrical circuit simulation is retried on a specified circuit block by excluding a specified vector. If there is a non-negligible variation from a result of a previous electrical circuit simulation, a dynamic timing analysis is retried on each circuit block included in a range that is influenced by an output signal of the specified circuit block. A delay characteristic library is reconstructed based on obtained analysis results.

This delay characteristic analyzing method makes it possible to perform reconstruction of a delay characteristic library only in a range that is influenced by variation of the dynamic delay characteristic of a specified circuit block.

According to a further aspect of the invention, for each of circuit blocks that have been formed for a newly read net list, it is judged whether the delay characteristic obtained for a circuit block constituting the delay-characteristic analyzed net list is usable. If it is reusable, the existing delay characteristic is used. In the case of a new circuit block, a dynamic timing analysis is performed on the circuit block concerned and a delay characteristic indicated by an analysis result is registered in a delay characteristic library.

According to this delay characteristic analyzing method, in a case where delay characteristic analysis is performed on a new net list obtained by changing part of a delay-characteristic analyzed net list, the entire new net list can be delay-characteristic analyzed by only considering a small number of new circuit blocks and dynamic timing analyses are performed on only those circuit blocks.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Principles

Figure 1:
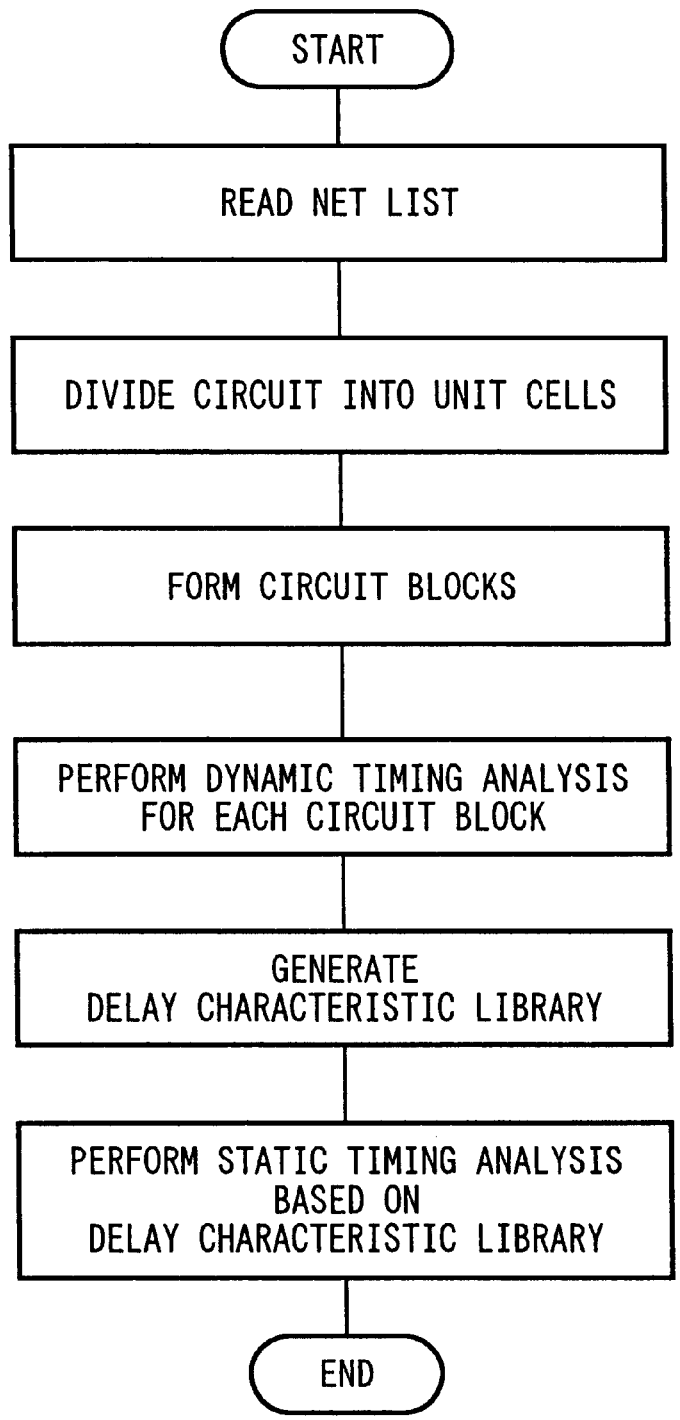
FIG. 1 shows the principle of a first delay characteristic analyzing method according to the present invention.

First, the principle of a first delay characteristic analyzing method for a custom LSI according to the present invention will be described with reference to FIG. 1. FIG. 1 shows the principle of the first delay characteristic analyzing method according to the invention.

The delay characteristic analyzing method shown in FIG. 1 consists of a reading procedure, a dividing procedure, a block forming procedure, a dynamic timing analyzing procedure, a library generating procedure, and a delay analyzing procedure.

The principle of the first delay characteristic analyzing method according to the invention is as follows.

The reading procedure reads a net list that represents an arrangement of and a connection between transistors and circuit elements equivalent to transistors. The dividing procedure divides a circuit to be analyzed, that is indicated by the net list, into unit cells each a minimum of which can operate as a logic circuit. The block forming procedure forms a plurality of circuit blocks by coupling together the unit cells according to a predetermined condition and the connection that is indicated by the net list. The dynamic timing analyzing procedure performs a dynamic timing analysis on each of the circuit blocks by performing an electrical circuit simulation by inputting a combination of proper input signals to the circuit blocks. The library generating procedure generates a delay characteristic library including delay characteristics of the circuit blocks, based on results of the electrical circuit simulations on each of the circuit blocks. The delay analyzing procedure performs a transmission delay analysis on a desired signal path by performing a static timing analysis based on the delay characteristic library by considering the circuit to be analyzed indicated by the net list to be a structure that is formed of interconnecting the circuit blocks.

The operation of the above delay characteristic analyzing method is as follows.

A net list that has been read by the reading procedure is divided into unit cells by the dividing procedure. Circuit blocks each of which is within a predetermined scale are formed by coupling unit cells to each other according to a predetermined condition by the block forming procedure. A dynamic timing analysis is performed on each circuit block by the dynamic timing analyzing procedure to evaluate delay characteristics of each circuit block. From these delay characteristics, a delay characteristic library including obtained analysis results is generated by the library generating procedure, and used in the processing of the delay analyzing procedure. And, the transmission delay of a desired signal path is analyzed in such a manner that the circuit to be analyzed that is indicated by the net list is regarded as a set consisted of the above circuit blocks.

A delay characteristic analyzing system can be constructed by units corresponding to the respective procedures shown in FIG. 1, that is, a reading unit, a unit dividing unit, a block forming unit, a dynamic analyzing unit, a library generating unit, and a transmission delay analyzing unit.

Figure 2:
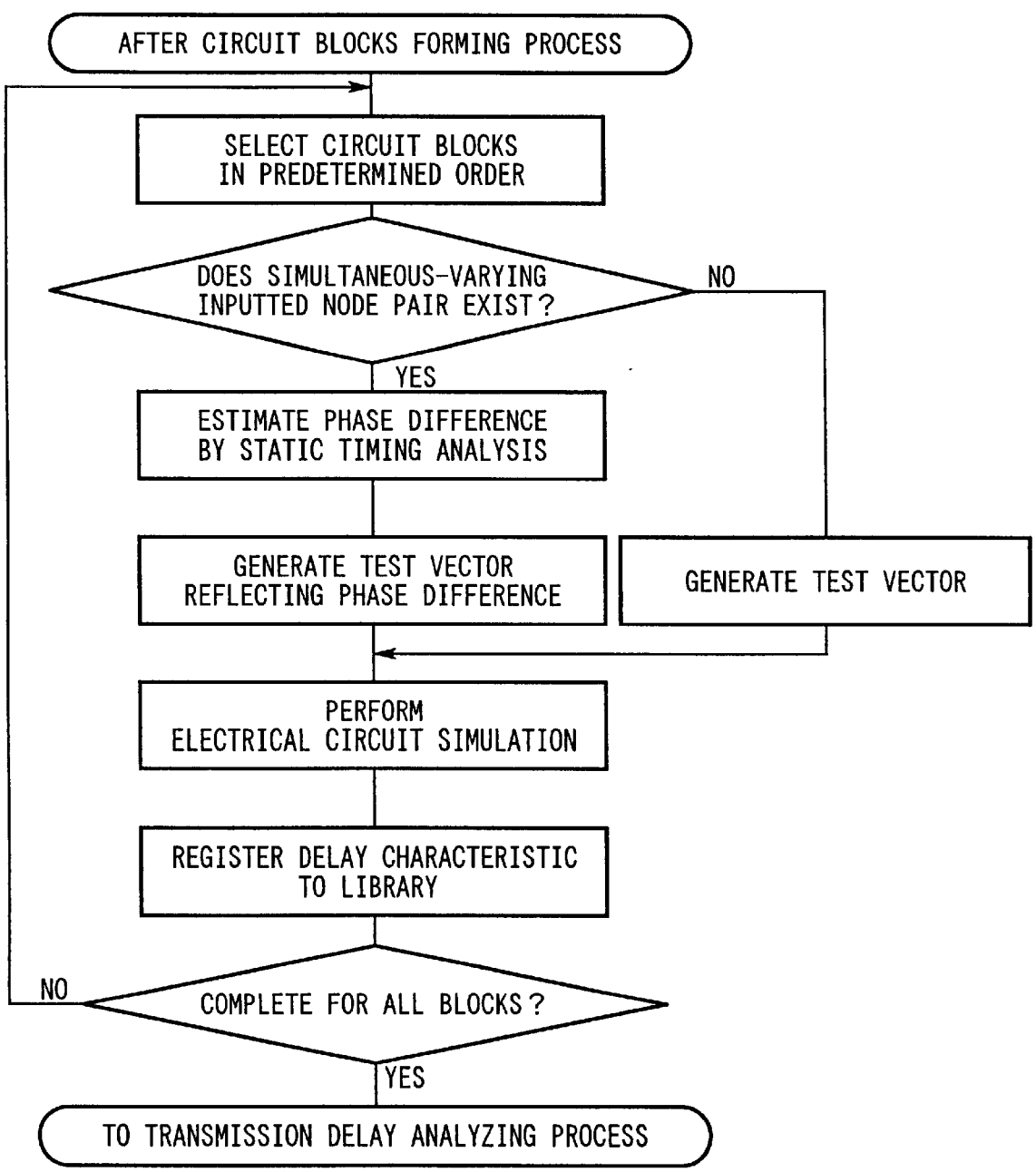
FIG. 2 shows the principle of a first dynamic timing analyzing procedure according to the present invention.

Next, the principle of a first dynamic timing analyzing procedure according to the invention will be described with reference to FIG. 2. FIG. 2 shows the principle of the first dynamic timing analyzing procedure according to the invention.

The first dynamic timing analyzing procedure shown in FIG. 2 consists of a block selecting procedure, a simultaneous variation judging procedure, a phase difference estimating procedure, and a specialized vector generating procedure.

The principle of the first dynamic timing analyzing procedure is as follows.

The block selecting procedure selects circuit blocks to be analyzed, in order from the circuit block closest to an external input terminal on the circuit to be analyzed and is indicated by the net list. The simultaneous variation judging procedure judges whether it is expected that signals that are inputted to input nodes of the selected circuit block vary simultaneously. The phase difference estimating procedure estimates a phase difference between the input signals that are expected to vary simultaneously, by performing a static timing analysis on signal paths from the external input terminal to the input nodes of the selected circuit block, the static timing analysis being based on delay characteristics that were obtained on circuit blocks ranging from the external input terminal to a circuit block that is provided immediately upstream of the selected circuit. When the judgment result is affirmative, instead of serving to generate an ordinary test vector, the specialized vector generating procedure performs an electrical circuit simulation on the selected circuit block by generating a test vector that gives the estimated phase difference.

The operation of the above dynamic timing analyzing procedure is as follows.

In the dynamic timing analyzing procedure, the block selecting procedure selects circuit blocks to be analyzed in order of closeness to an external input terminal. If the simultaneous variation judging procedure has judged that the selected circuit block has a simultaneous-varying inputted node pair, the phase difference estimating procedure estimates a phase difference by performing a static timing analysis, specialized vector generating procedure generates a test vector that reflects the estimated value, and the generated test vector is applied to an electrical circuit simulation, to evaluate the delay characteristics of the circuit block having a simultaneous-varying inputted node pair.

A delay characteristic obtained for each selected circuit block by the dynamic timing analyzing procedure in the above-described manner is registered in the delay characteristic library and used for dynamic timing analyses for circuit blocks of the next stage downward. Then, a static timing analysis is performed after delay characteristics of all the circuit blocks are registered in the delay characteristic library.

Figure 3:
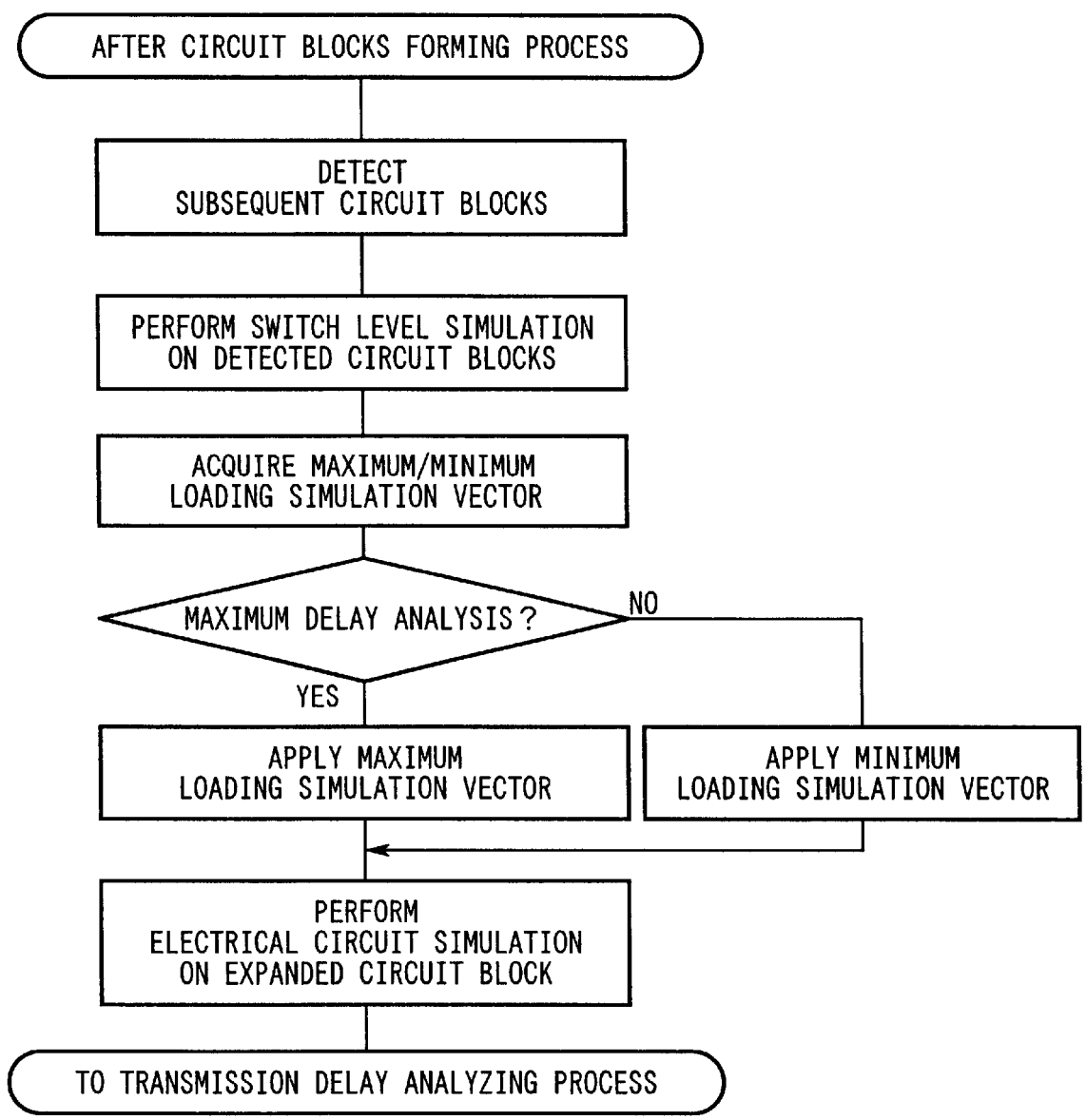
FIG. 3 shows the principle of a second dynamic timing analyzing procedure according to the present invention.

Next, the principle of a second dynamic timing analyzing procedure according to the invention will be described with reference to FIG. 3. FIG. 3 shows the principle of the second dynamic timing analyzing procedure according to the invention.

The second dynamic timing analyzing procedure shown in FIG. 3 consists of a downstream block detecting procedure, a preprocessing simulation procedure, a feature vector generating procedure, a purpose judging procedure, a vector applying procedure, and an expanded simulation procedure.

The principle of the second dynamic timing analyzing procedure according to the invention is as follows.

The downstream block detecting procedure detects other circuit blocks that are connected to output nodes of the circuit block to be dynamic-timing analyzed. The preprocessing simulation procedure partly performs a switch level simulation on each of the detected circuit blocks by using a proper test vector. The feature vector generating procedure determines, for each of the detected circuit blocks, sets of input signals as a maximum loading simulation vector and a minimum loading simulation vector with which the number of transistors where a change of state occurs is largest and smallest, respectively, based on a result of the switch level simulation. The purpose judging procedure judges whether to determine a maximum delay for the circuit block to be analyzed. When the purpose judging procedure has judged that a maximum delay should be determined, the vector applying procedure inputs the maximum loading simulation vectors to the respective detected circuit blocks as sets of input signals. In the case of determining a minimum delay, the vector applying procedure inputs the minimum loading simulation vectors to the respective detected circuit blocks as sets of input signals. The expanded simulation procedure performs the electrical circuit simulation on the circuit block to be analyzed, the circuit block to be analyzed being a part of an electrical circuit that also includes the detected circuit blocks.

The operation of the above dynamic timing analyzing procedure is as follows.

Prior to an electrical circuit simulation on each circuit block, the preprocessing simulation procedure and the feature vector generating procedure determines a maximum loading simulation vector and a minimum loading simulation vector for each of downstream circuit blocks detected by the downstream block detecting procedure. When the expanded simulation procedure performs an electrical circuit simulation on an expanded circuit that is composed of the circuit block to be analyzed and the detected downstream circuit blocks, the vector applying procedure inputs the maximum loading simulation vectors or minimum loading simulation vectors to the respective downstream circuit blocks in accordance with a judgment result of the purpose judging procedure.

Figure 4:
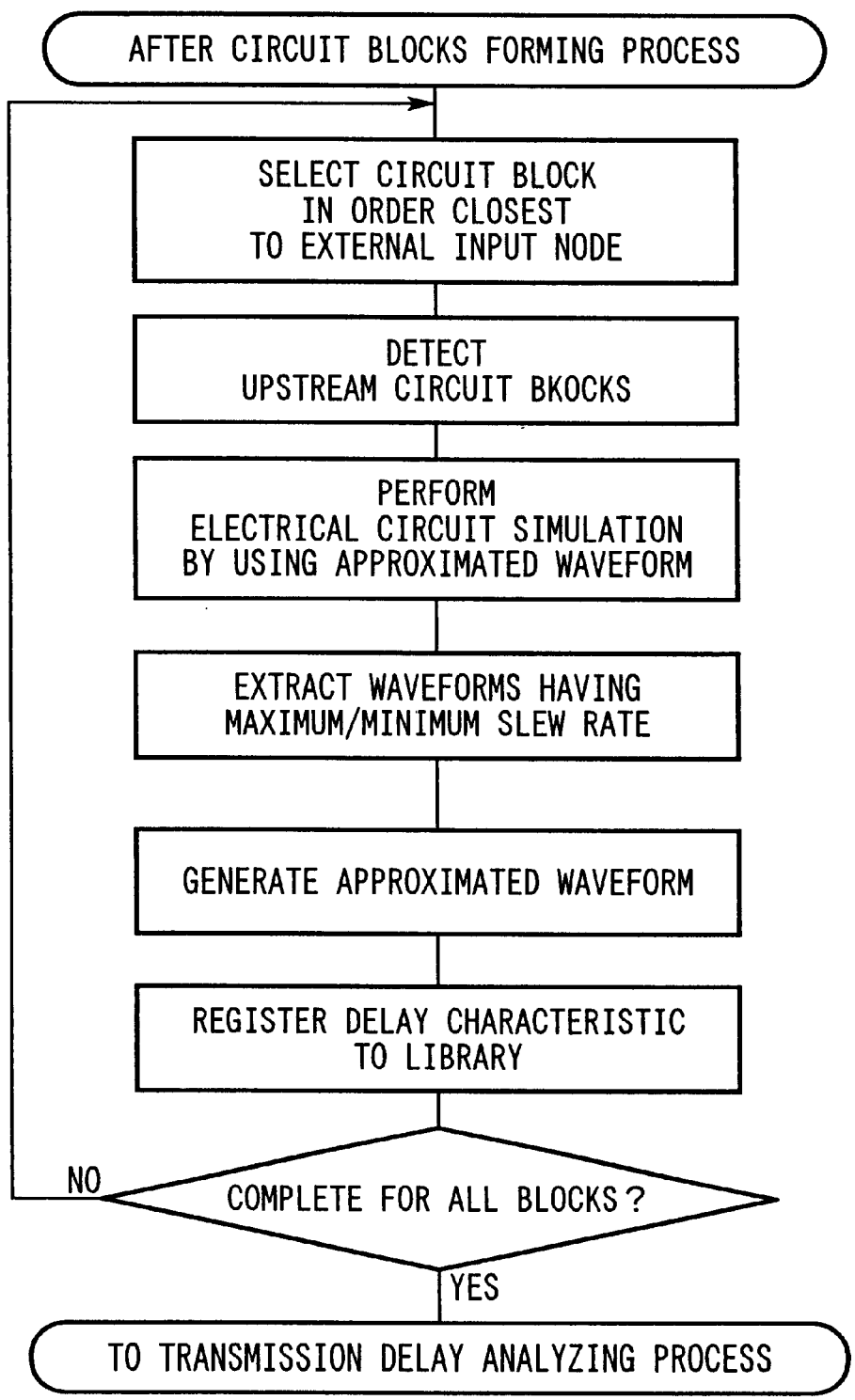
FIG. 4 shows the principle of a third dynamic timing analyzing procedure according to the present invention.

Next, the principle of a third dynamic timing analyzing procedure according to the invention will be described with reference to FIG. 4. FIG. 4 shows the principle of the third dynamic timing analyzing procedure according to the invention.

The third dynamic timing analyzing procedure shown in FIG. 4 consists of a block selecting procedure, an upstream detecting procedure, an approximated waveform applying procedure, an output waveform extracting procedure, and an approximated waveform generating procedure.

The principle of the third dynamic timing analyzing procedure according to the invention is as follows.

The block selecting procedure selects circuit blocks to be analyzed in order from the circuit block closest to an external input terminal on the circuit to be analyzed and indicated by the net list.

The upstream clock detecting procedure detects upstream circuit blocks connected to input nodes of the circuit block to be analyzed. The approximated waveform applying procedure performs, to an electrical circuit simulation on the circuit block to be analyzed, approximated waveforms corresponding to the respective detected upstream circuit blocks as input signal waveforms that are inputted to the respective input nodes of the circuit block to be analyzed. The output waveform extracting procedure extracts a waveform having a maximum slew rate and a waveform having a minimum slew rate from output waveforms that are output from each of output nodes of the circuit block to be analyzed by the electrical circuit simulation. The approximated waveform generating procedure generates an approximated waveform that reflects features of the maximum slew rate waveform and the minimum slew rate waveform for each of the output nodes, and allows the generated approximated waveforms to be used in an electrical circuit simulation on a downstream circuit block.

The operation of the above dynamic timing analyzing procedure is as follows.

The block selecting procedure selects circuit blocks to be analyzed in order from the circuit block closest to an external input terminal. When each circuit block is analyzed, the upstream block detecting procedure detects upstream circuit blocks that are connected to the selected circuit block. The approximated waveform applying procedure applies, to an electrical circuit simulation on the circuit block to be analyzed, as input signal waveforms, approximated waveforms that were obtained in dynamic timing analyses on the respective upstream circuit blocks. Based on results of the electrical circuit simulation, the approximated waveform generating procedure generates approximated waveforms each of which reflects features of output signals of the circuit block to be analyzed, and provides the generated approximated waveforms to be used in an electrical circuit simulation on a downstream circuit block.

Figure 5:
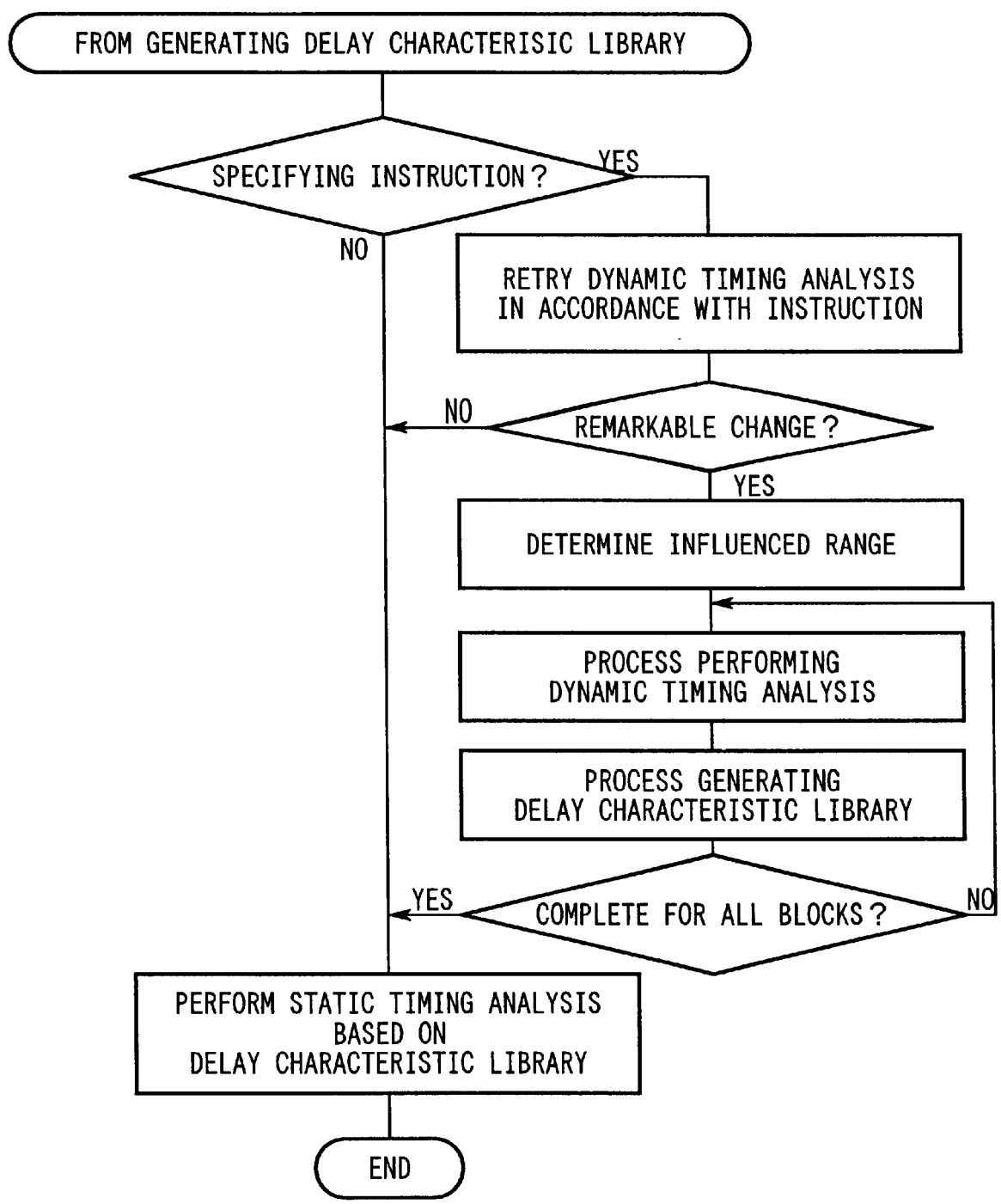
FIG. 5 shows the main part of the principle of a second delay characteristic analyzing method according to the present invention.

Next, the principle of a second delay characteristic analyzing method according to the invention will be described with reference to FIG. 5. FIG. 5 shows the main part of the principle of the second delay characteristic analyzing method according to the invention.

The second delay characteristic analyzing method shown in FIG. 5 consists of a retry procedure, a variation judging procedure, a range analyzing procedure, a restricted range analyzing procedure, and a reentry procedure.

The principle of the second delay characteristic analyzing method according to the invention is as follows.

The retry procedure reactivates the dynamic timing analyzing procedure to perform a dynamic timing analysis on a circuit block that is specified by an input instruction to exclude a specified test vector. The variation judging procedure judges whether a remarkable variation has occurred in the delay characteristic due to the exclusion of the specified test vector based on a result of the analysis that has been performed by the reactivated dynamic timing analyzing procedure. In response to an affirmative judgment result, the range determining procedure determines circuit blocks that are included in such a range that their delay characteristics are influenced by the variation in the delay characteristic of the specified circuit block. The restricted range analyzing procedure reactivates the dynamic timing analyzing procedure to perform a dynamic timing analysis on each of the determined circuit blocks. The reentry procedure again registers analysis results obtained for the specified block and the determined circuit blocks in the delay characteristic library.

The operation of the above delay characteristic analyzing method is as follows.

After a delay characteristic library was generated, in response to an input instruction, the retry procedure instructs an electrical circuit simulation to be performed on a specified circuit block in condition that a specified test vector is excluded. If there is a non-negligible variation between a result of the electrical circuit simulation and a result of a previous electrical circuit simulation, in response to a judgment result of the variation judging procedure, a dynamic timing analysis is performed again on each circuit block included in a range that is influenced by an output signal of the specified circuit block. Based on analysis results obtained in this procedure, the circuit blocks detected by the range determining procedure are subjected to the restricted range analyzing procedure to evaluate delay characteristics again for these circuit blocks respectively. Obtained analysis results are processed by the reentry procedure, whereby a delay characteristic library is reconstructed.

A second delay characteristic analyzing system can be constructed by adding, to the above-mentioned first delay characteristic analyzing system, sections corresponding to the respective procedures shown in FIG. 5, that is, an analysis controlling section, an activation controlling section, a variation judging section, a determining section, an analysis activating section, and a generation activating section.

Figure 6:
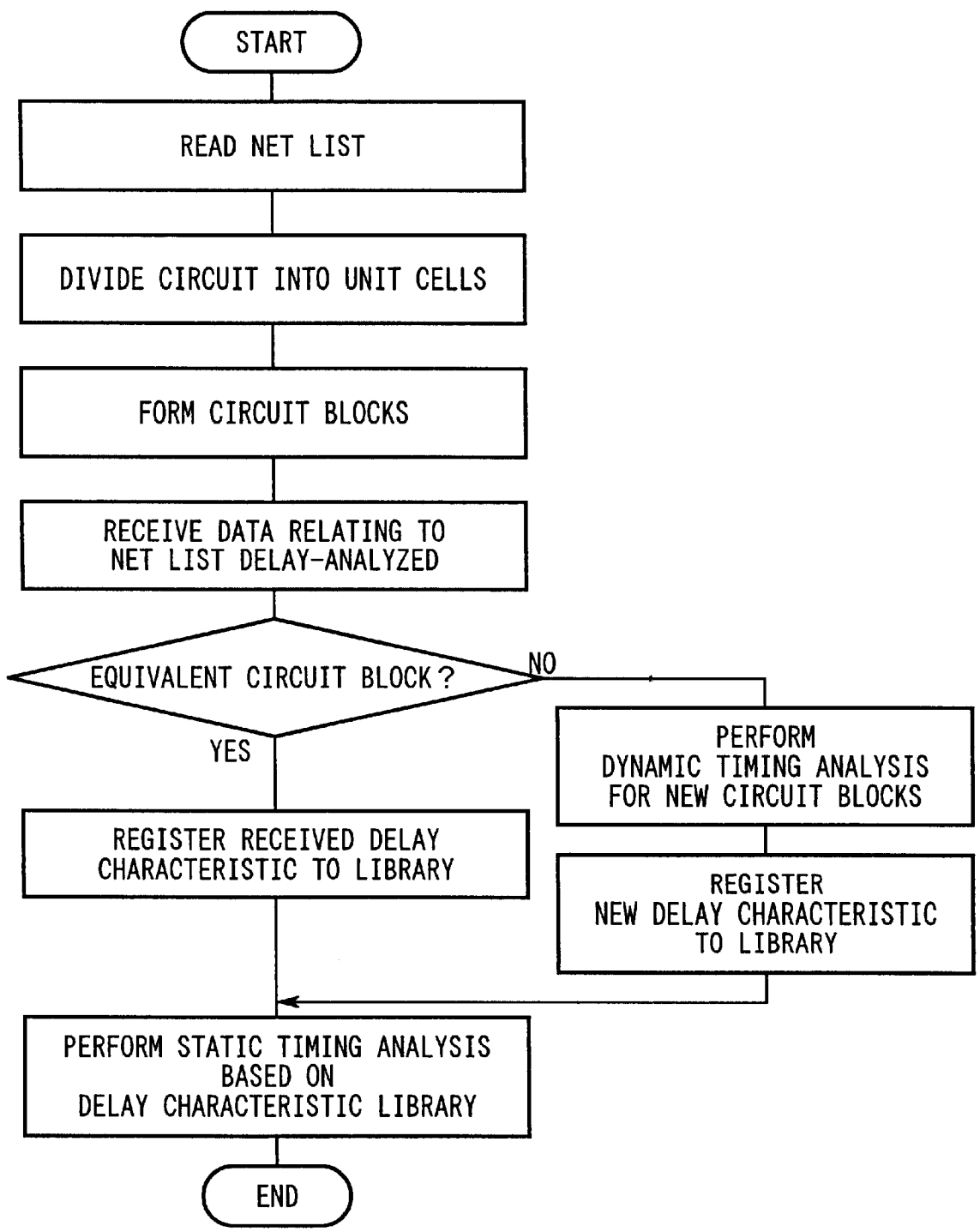
FIG. 6 shows the main part of the principle of a third delay characteristic analyzing method according to the present invention.

Next, the principle of a third delay characteristic analyzing method according to the invention will be described with reference to FIG. 6. FIG. 6 shows the main part of the principle of the third delay characteristic analyzing method according to the invention.

The delay characteristic analyzing method shown in FIG. 6 has an analyzed net list reading procedure, a reusability judging procedure, an analysis controlling procedure, and a resource entry procedure in place of the dynamic timing analyzing procedure that employs all circuit blocks as subjects of analysis.

The principle of the third delay characteristic analyzing method according to the invention is as follows.

The analyzed net list reading procedure receives, for a net list that has been performed a delay characteristic analysis, data relating to respective circuit blocks that were dynamic timing analyzed and data indicating delay characteristics of the respective circuit blocks. The reusability judging procedure judges, for each circuit block on a newly read net list, whether the delay characteristic data obtained by the delay analysis on the delay-characteristic analyzed net list is reusable or a new dynamic timing analysis needs to be performed, based on the data received for the delay-characteristic analyzed net list and data relating to the circuit blocks of the new net list. The analysis controlling procedure performs the dynamic timing analyzing procedure and the library generating procedure on a new circuit block to be made a subject of the dynamic timing analysis. The resource entry procedure registers, for a circuit block whose existing delay characteristic has been judged usable, a delay characteristic of a corresponding circuit block as an element of the delay characteristic library of the newly read net list.

The operation of the above delay characteristic analyzing method is as follows.

For each of circuit blocks that have been formed for a newly read net list, the reusability judging procedure judges whether the delay characteristic obtained for a circuit block constituting the delay-characteristic analyzed net list that has been received by the analyzed net list reading procedure is usable. If it is reusable, the resource entry procedure registers the existing delay characteristic to the delay characteristic library to enable its use. In the case of a new circuit block, the analysis controlling procedure activates, for the circuit block concerned, the dynamic timing analyzing procedure and the library generating procedure, whereby a delay characteristic indicated by an analysis result is registered in the delay characteristic library.

A third delay characteristic analyzing system can be constructed by adding, to the above-mentioned first delay characteristic analyzing system, units corresponding to the respective procedures shown in FIG. 6, that is, a data input unit, a block judging unit, and an existing characteristic entry unit.

Embodiments

Embodiments of the invention will be hereinafter described in detail with reference to the drawings.

Figure 7:
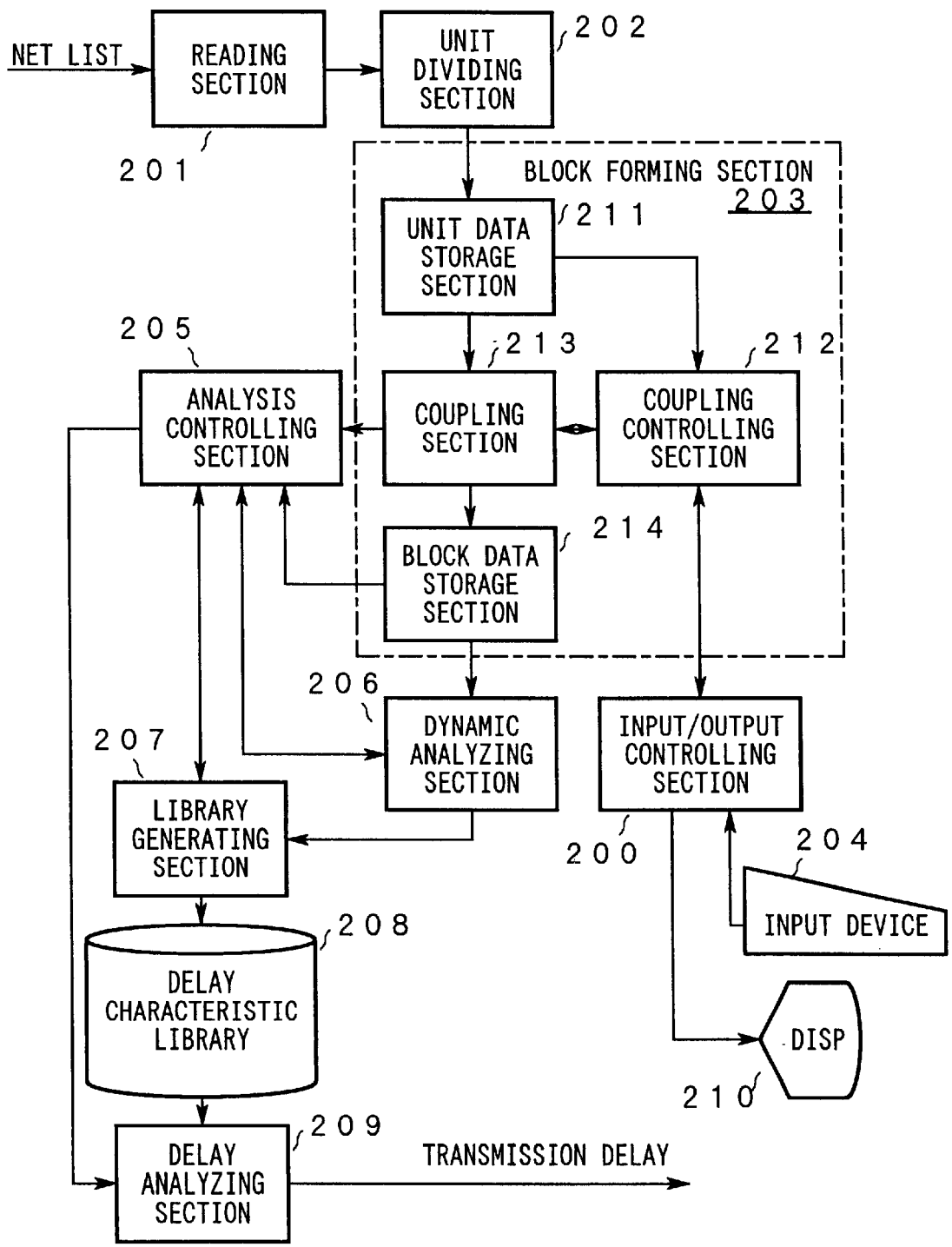
FIG. 7 shows a first delay characteristic analyzing system according to a first embodiment of the present invention.

FIG. 7 shows a first delay characteristic analyzing system according to the first embodiment of the invention.

In the first delay characteristic analyzing system shown in FIG. 7, a net list that has been read by a reading section 201 is passed to a unit dividing section 202, where it is divided into minimum unit cells each of cells is capable of operating as a logic element.

The unit cells thus obtained and data relating to a connection between those unit cells are stored in a unit data storage section 211 that is provided in a block forming section 203. An instruction input through an input device 204 such as a keyboard is passed to a coupling controlling section 212 via an input/output controlling section 200. The coupling controlling section 212 controls processing that a coupling section 213 performs coupling on the unit cells based on the instruction and the data being held by the unit data storage section 211. In this manner, processing of forming proper circuit blocks is performed.

Based on a notice or the like that is supplied from the coupling section 213, the coupling controlling section 212 generates a proper message or the like, which is passed to a display device (DISP) 210 via the input/output controlling section 200 and is displayed thereon.

The circuit blocks that have been formed by the coupling section 213 and the data relating to the connections between the circuit blocks are supplied to an analysis controlling section 205 and a dynamic analyzing section 206 via a block data storage section 214 and are used for processing in those sections.

The role of the dynamic analyzing section 206 is to performs a dynamic timing analysis using an electrical circuit simulation on a circuit block designated by the analysis controlling section 205 based on data acquired from the block data storage section 214.

A delay characteristic of the circuit block concerned is extracted by a library generating section 207 from an analysis result obtained by the dynamic analyzing section 206 and is registered as an element of a delay characteristic library 208.

After delay characteristics of all circuit blocks are registered in the delay characteristic library 208, a delay analyzing section 209 performs a static timing analysis using the delay characteristic library 208, whereby a transmission delay of a desired transmission path can be obtained.

Next, the operation of the first delay characteristic analyzing system of FIG. 7 will be described.

Figure 8:
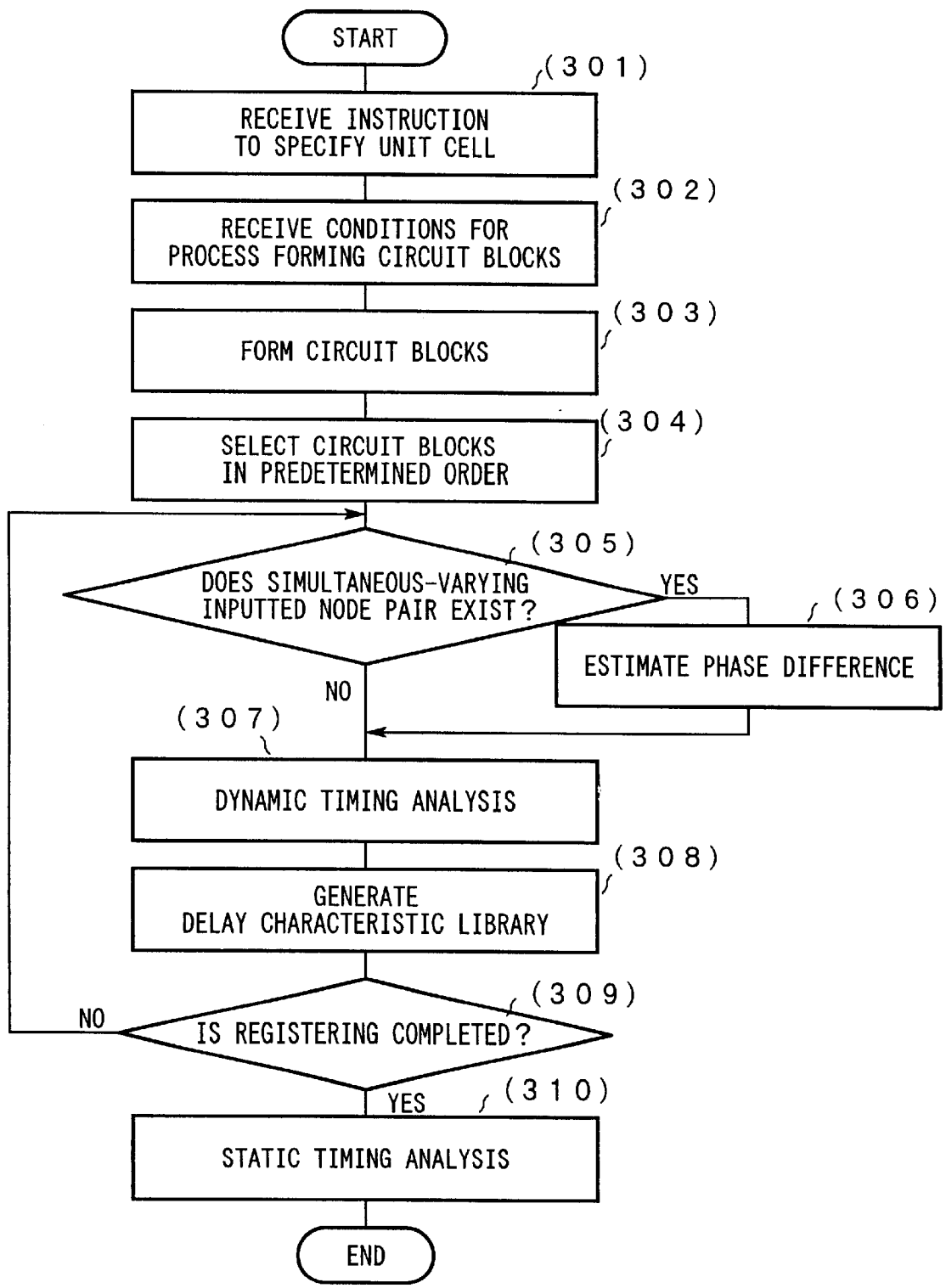
FIG. 8 is a flowchart showing the operation of the first delay characteristic analyzing system.

FIG. 8 is a flowchart showing the operation of the first delay characteristic analyzing system.

First, an instruction that specifies unit cells that should be processed being separated from the other unit cells is input through the input device 204, passed to the coupling controlling section 212 via the input/output controlling section 200, and accepted by the coupling controlling section 212 (step 301).

At this time, for example, it is proper for the coupling controlling section 212 to accept a unit cell for which processing of forming a circuit block including it should be performed preferentially or a unit cell whose coupling destination should be determined by the operator.

An instruction that specifies conditions that should be applied to processing of forming circuit blocks is input through the input device 204, passed to the coupling controlling section 212 via the input/output section 200, and accepted by the coupling controlling section 212 (step 302).

Examples of conditions that should be applied in forming circuit blocks are as follows:

Condition 1:

The number of transistors included in a circuit block should be smaller than or equal to a predetermined threshold value nth.

Condition 2:

A circuit block should include at least one transistor whose source node is connected to a power supply terminal or a ground terminal.

Condition 3:

An inverter block that is connected to an external output terminal of a custom LSI should form a circuit block only with a series of inverter blocks that are connected in series to the inverter block.

Condition 4:

A unit cell to which both of an input node and an output node of an inverter block are connected should be coupled to and integrated with a circuit block including the inverter block.

Condition 5:

A unit cell that is connected to input nodes where signals are expected to vary simultaneously should be coupled to and integrated with the circuit block including these input nodes.

Then, in response to an instruction from the coupling controlling section 212, the coupling section 213 performs processing of forming circuit blocks.

FIGS. 9A and 9B and FIGS. 10A and 10B illustrate an operation of forming circuit blocks.

Figure 9:
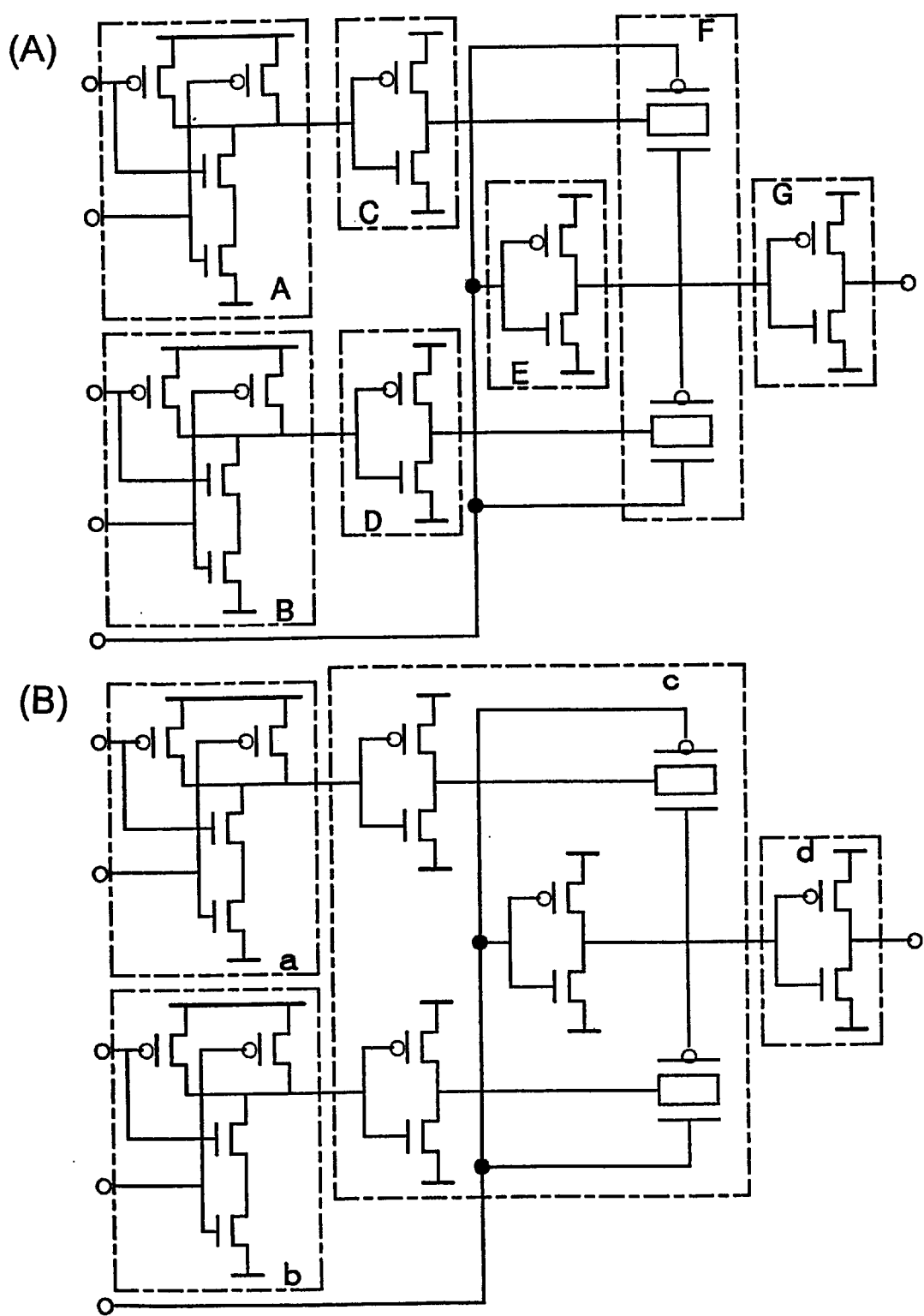
FIGS. 9A and 9B illustrate an operation of forming circuit blocks.

In a transistor circuit shown in FIG. 9A, unit cells A and B are NAND blocks, unit cells C, D, E, and G are inverter blocks, and a unit cell F is a multiplexer block which is composed of two pass transistors.

For example, if an instruction has been made to the effect that priority is given to coupling to the unit cell F shown in FIG. 9A, in response to an instruction from the coupling controlling section 212 the coupling section 213 starts processing of forming a circuit block including the unit cell F with priority over processing for the other unit cells. In the unit cell F, the source node of each of the two transistors is not connected to a power supply terminal nor a ground terminal. Therefore, first, to satisfy the above condition 2, the two unit cells C and D that are adjacent to the unit cell F are coupled together. The complementary nodes of the pass transistors provided in the unit cell F are connected to the input node and the output node, respectively, of the immediately upstream inverter block (unit cell E), to satisfy the above condition 4. Therefore, the coupling section 213 causes the unit cell E to be coupled to and integrated with the above-formed circuit block. As a result, as shown in FIG. 9B, a circuit block is formed that is composed of the unit cells C, D, E, and F.

On the other hand, the unit cell G is the inverter block that is connected to the external output node and has no inverter block that is connected in series to the inverter block (unit cell G). Therefore, the coupling section 213 forms a circuit block that is formed by the unit cell G alone.

Causing the coupling section 213 to form circuit blocks that satisfy the condition 2 in the above manner makes it possible to perform an electrical circuit simulation (described later) by assuming a state that drive power is supplied to circuit elements of the circuit blocks under correct conditions. Therefore, a correct simulation result is expected.

Causing the coupling section 213 to form circuit blocks that satisfy the condition 3 makes it possible to reduce greatly the amount of processing of an electrical circuit simulation in a dynamic timing analysis (described later) by utilizing the feature of the inverter block that it is a one-input logic. This is because performing a dynamic timing analysis on such a circuit block enables to achieve sufficient accuracy on generation of a test vector for one input and performing of an electrical circuit simulation for a combination of the generated test vector and several kinds of connected loads.

Figure 10:
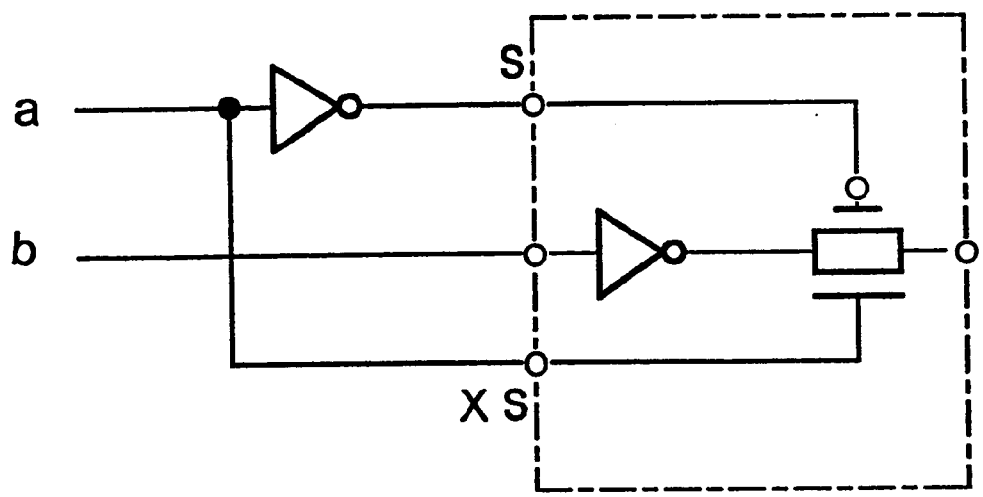
FIGS. 10A and 10B illustrate an operation of forming circuit blocks.
Figure 10:
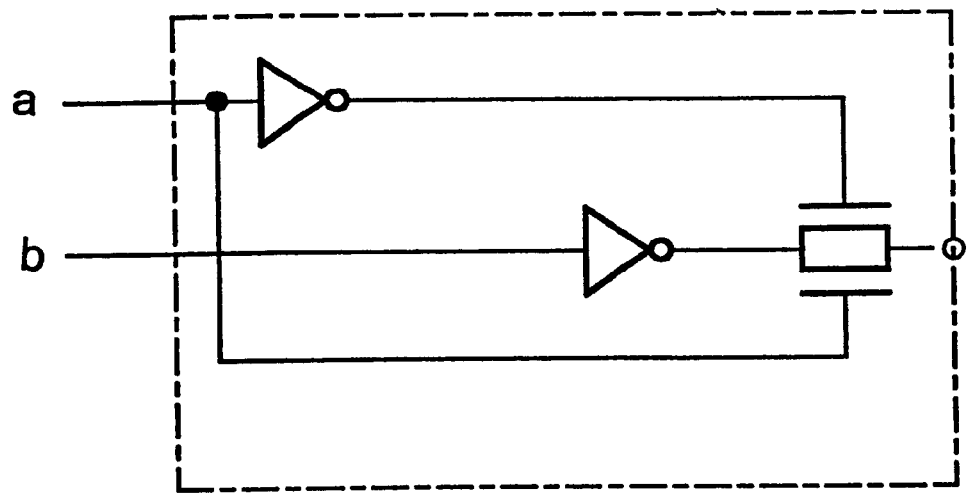

By coupling together the unit cells (indicated by symbols a and b in FIG. 10A) according to the condition 4 or 5, the coupling section 213 can remove a simultaneous-varying inputted node pair such as input nodes S and XS shown in FIG. 10A. Because of this, the accuracy of an electrical simulation in a dynamic timing analysis (described later) can greatly be increased. Elimination of a simultaneous-varying inputted node pair is the solution to one of the troublesome problems that leads to lowering the accuracy of electrical circuit simulation.

Applying the condition 1 to circuit blocks obtained by the circuit block formed by the coupling section 213 makes it possible to restrict and almost equalize the sizes of circuit blocks that are formed based on a custom LSI. This makes it possible to prevent a huge circuit block from being formed as unit cells or circuit blocks are integrated with each other according to the condition 5, to thereby shorten the time necessary for an electrical circuit simulation for each circuit block to a realistic time.

If a circuit block cannot be integrated with another circuit block due to the condition 1 (limitation on the number of transistors included in a circuit block) in spite of the fact that it is apparent that its simultaneous-varying inputted node pair would disappear if the condition 5 were applied, it is proper for the coupling section 213 to add data indicating the simultaneous-varying inputted node pair in the circuit block formed to data relating to the circuit block, store resulting data in the block data storage section 214 for future use in a dynamic timing analysis.

Causing the coupling section 213 to perform processing of forming circuit blocks with priority given to a unit cell specified by the operator makes it possible to form circuit blocks that reflect the intentions of the operator of the delay characteristic analyzing system, that is, the designer, by effectively utilizing his experiences and knowledge.

Further, it is possible to get an instruction from the operator on a specified unit cell by asking with a proper message that is made to be displayed on the display device 210 via the input/output controlling section 200 by the coupling controlling section 212. The proper message may be prepared on the basis of the exchanged data of unit cells that is about to be coupled to and integrated with a circuit block being formed between coupling section 213 and coupling controlling section 212, when the specified unit cell is subjected to forming process. By executing coupling of the unit cell concerned in response to an instruction that is input in response to the message, the experiences and knowledge of the operator of the delay characteristic analyzing system, that is, the designer, can be used effectively in a situation that a coupling destination of the unit cell concerned should be determined.

Circuit blocks that satisfy the above-described conditions are formed in the above manner. When every unit cell has been included in one of the circuit blocks, the circuit block formation processing (step 303) is finished and the processing of step 305 onward is started.

The analysis controlling section 205 shown in FIG. 7 sequentially selects the circuit blocks in order of closeness to the external input nodes of the custom LSI by referring to the block data storage section 214 (step 304 in FIG. 8).

Based on the data corresponding to the circuit block concerned, the analysis controlling section 205 judges whether the circuit block has a simultaneous-varying input node pair (step 305).

For example, when the circuit block a shown in FIG. 9B is selected, the analysis controlling section 205 judges that no simultaneous-varying node pair exists (the judgment result at step 305 is negative). In response, the dynamic analysis section 206 performs a dynamic timing analysis on this circuit block (step 307).

Figure 11:
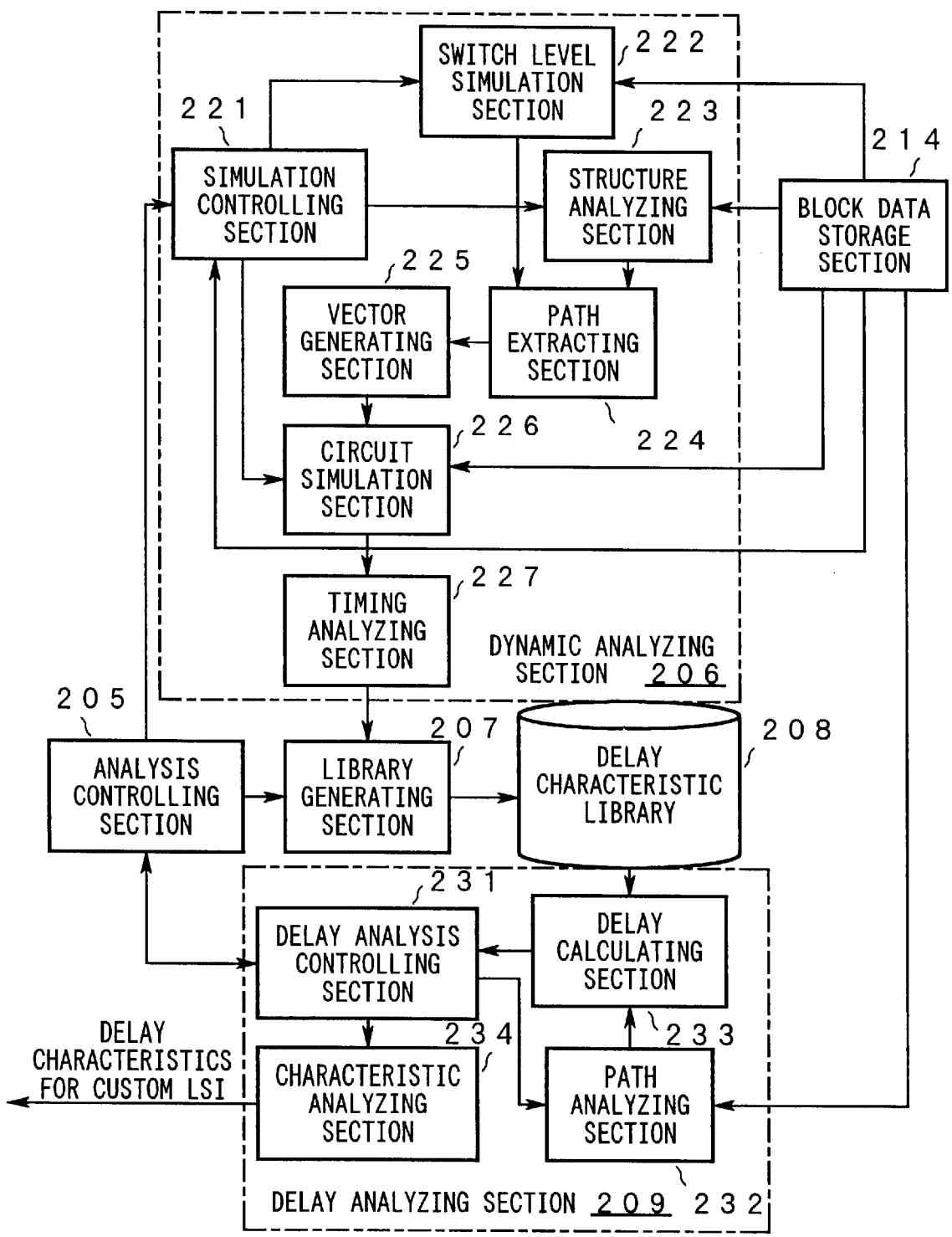
FIG. 11 shows detailed configurations of a dynamic analyzing section and a delay analyzing section.

FIG. 11 shows detailed configurations of the dynamic analyzing section 206 and the delay analyzing section 209.

In the dynamic analyzing section 206 shown in FIG. 11, based on an instruction from the analysis controlling section 205, a simulation controlling section 221 shows the circuit block concerned as a subject of simulation to a switch level simulation section 222 and a structure analyzing section 223 and activates the processing of each of those sections.

The switch level simulation section 222 and the structure analyzing section 223 acquires information relating to the designated circuit block from the block data storage section 214 of the block forming section 204 (see FIG. 7), performs a switch level simulation on the circuit block concerned and analyzes the structure of each transistor included in the circuit block concerned based on the acquired data, and provide results of the respective pieces of processing to be processed by a path extracting section 224.

As described above, at this stage, the sizes of the circuit blocks as subjects of the switch level simulation section 222 and the structure analyzing section 223 are much smaller than the circuit scale of the entire custom LSI. Therefore, the time necessary for each of the switch level simulation and the transistor structure analysis can be made short.

Based on results of the above pieces of processing, the path extracting section 224 extracts paths (hereinafter referred to as "active paths") along which a signal may be transmitted logically from among the paths connecting an input node and an output node in the circuit block concerned and provides the extracted paths to be processed by a vector generating section 225.

In response, the vector generating section 225 generates a test vector for each of the active paths. A circuit simulation section 226 performs an electrical circuit simulation on the circuit block concerned using the generated test vectors.

It goes without saying that the time necessary for the electrical circuit simulation is short because the size of the circuit block to be processed at the circuit simulation section 226 is small. Further, generating test vectors for only extracted active paths in the above-described manner can make the processing time much smaller than in a case where test vectors are generated simply by using an automatic vector generation method or the like.

Based on an electrical circuit simulation result thus obtained, a timing analyzing section 227 analyzes the dynamic characteristics of the circuit block concerned. An analysis result is to be processed by the library generating section 207.

Based on the analysis result obtained by the dynamic analyzing section 206, the library generating section 207 generates a delay characteristic library (step 308 in FIG. 8).

At this time, the library generating section 207 generates a delay model that expresses the delay characteristic of the circuit block concerned as the following function (Equation (1)) of the slew rate (tsin) of an input signal and the output load (c):

$$(\text{Delay time } d) = (\text{intrinsic delay } t_0(t \sin)) + (\text{correction delay } f(c, t \sin)) \quad (1)$$

Figure 12:
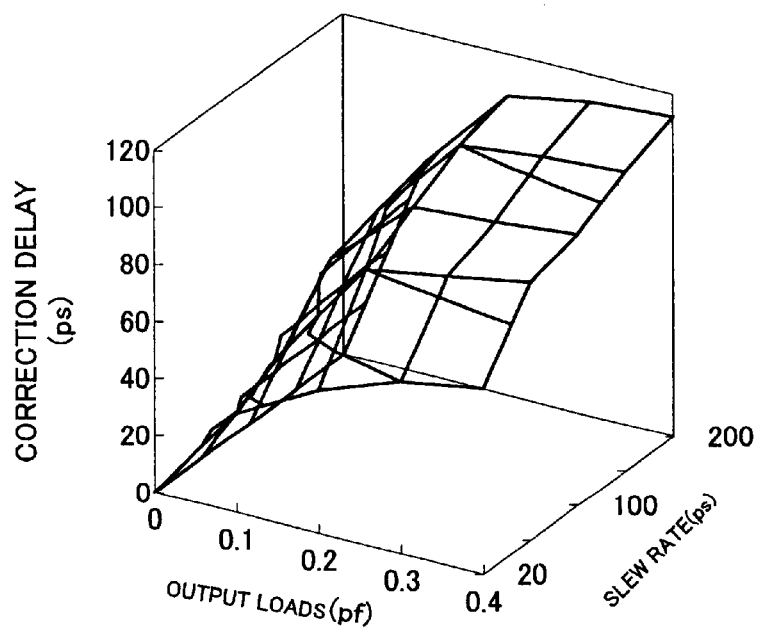
FIGS. 12A and 12B show a delay characteristic of a circuit block.

It is proper for the library generating section 207 to then calculate a delay time for each combination of typical input signal slew rates and output loads based on the delay model, generate a two-dimensional table as shown in FIG. 12A showing the corresponding relationship for every combination of input signal slew rates and output loads and the delay times, and register the table as a delay characteristic of the circuit block concerned. FIG. 12B is a graphical representation of the two-dimensional table of FIG. 12A.

The above processing of generating a delay characteristic library is basically equivalent to the conventional processing of generating a general-purpose cell library for a static timing analysis, and hence it was not described above in detail.

When the circuit block that has a simultaneous-varying inputted node pair is selected at step 304 (see FIG. 8), the simulation controlling section 221 estimates a difference between transmission times of respective paths that reach the two input nodes concerned (step 306).

At this time, for example, it is proper for the simulation controlling section 221 to determine expected values of time that a signal takes to reach the input nodes concerned after departing from an external input node of the custom LSI and traveling along the respective paths based on the numbers of transistors existing on the respective paths, operation characteristics of an average transistor, and other information, employ the difference between the expected values as a phase difference between signals that are input to the two input nodes, and allow the difference between the expected values to be used in the processing (step 307) of the circuit simulation section 226.

At the above-described step 306, instead of estimating a phase difference between simultaneous-varying input signals using a statistical method, the simulation controlling section 221 may accept, as a phase difference, a value that is input by the operator and allow it to be used in the processing of the circuit simulation section 226.

Performing an electrical circuit simulation by applying the thus-estimated phase difference to the simultaneous-varying inputted node pair makes it possible to analyze the dynamic timing characteristic of the circuit block concerned in a state that a statistically probable phase difference is set for simultaneous-varying input signals.

The processing of analyzing the dynamic timing characteristic and the processing of generating a delay characteristic library are performed in the above-described manner repeatedly for the circuit blocks formed by the block forming section 204. The judgment result at step 309 turns affirmative when those pieces of processing have been completed for all circuit blocks. In response to an instruction from the analysis controlling section 205, the delay analyzing section 209 starts a static timing analysis (step 310; see FIGS. 8 and 11).

In the delay analyzing section 209 shown in FIG. 11, in response to an instruction from the analysis controlling section 205, a delay analysis controlling section 231 activates processing of a path analyzing section 232 and requests it to analyze paths from an external input node to an external output node of the custom LSI. In response, based on the information relating to the circuit blocks that is stored in the block data storage section 214, the path analyzing section 232 judges whether each path from the external input node to the external output node is an active path. Only active paths are selected and subjected to processing of a delay calculating section 233. For each active path, the delay calculating section 233 accumulates delay times indicated by delay characteristics that are registered in the delay characteristic library 208 as corresponding to respective circuit blocks on the active path, whereby an estimated value of the transmission delay of each active path is obtained. The transmission delays obtained for the respective active paths in the above manner are passed to a characteristic analyzing section 234. The characteristic analyzing section 234 analyzes the transmission delays corresponding to the respective active paths, whereby a delay characteristic of the entire custom LSI is obtained.

By executing the above-described steps 301–309, a delay characteristic library representing delay characteristics of a number of circuit blocks constituting an arbitrary net list of a large-scale custom LSI can be generated automatically and a static timing analysis can be performed by using the delay characteristic library obtained for those circuit blocks in such a manner that the net list of the custom LSI is regarded as a set of those circuit blocks.

As described above, delay characteristics registered in the delay characteristic library 208 are ones obtained based on results of electrical circuit simulations performed on individual circuit blocks. And the delay characteristics are accurate enough to satisfy the accuracy that is required for the transistor-level designing. Therefore, the delay characteristics of the entire custom LSI can be analyzed with extremely high accuracy by a static timing analysis using this delay characteristic library.

Further, since each circuit block is generated automatically based on a net list as a subject of delay characteristic analysis, the delay characteristic analyzing system can flexibly deal with designing of a custom LSI having a very high degree of freedom such as a full custom LSI. Naturally, it is not necessary to prepare a general-purpose cell library unlike the case of a conventional static timing analysis.

Still further, by the block forming section 204 forming, in the above-described manner, circuit blocks that satisfy the above-described conditions 1–5, various problems that would occur if a partial circuit of a custom LSI is subjected to a dynamic timing analysis independently, that is, insufficient accuracy of analysis of the dynamic timing analysis and a long processing time, can be solved at a stroke and a delay characteristic of the entire custom LSI can be determined quickly with very high accuracy. In particular, the causes of errors itself in the dynamic timing analysis can be eliminated by removing simultaneous-varying inputted node pairs by coupling unit cells or circuit blocks together according to the condition 4 or 5.

Among the methods for preventing deterioration of the accuracy of the dynamic timing analysis due to a simultaneous-varying inputted node that could not be removed in the process of forming circuit blocks are not only the above-described methods of using a phase difference that is determined statistically or input by an operator but also a method of estimating a phase difference by using a static timing analysis.

For example, a method is possible in which instead of estimating a phase difference by using a statistical method at step 306 in FIG. 8, the simulation controlling section 221 (see FIG. 11) activates the delay analyzing section 209 via the analysis controlling section 205 and requests it to perform a static timing analysis on paths that connect a simultaneous-varying inputted node pair to an external input node of a custom LSI. When receiving delay times obtained for the respective paths via the analysis controlling section 205, it is proper for the simulation controlling section 221 to determine a difference between those delay times as a phase difference for the simultaneous-varying inputted node pair and allow it to be used in the processing of the circuit simulation section 226.

In this manner, a phase difference for a simultaneous-varying inputted node pair included in the subject circuit block can be determined with high accuracy by utilizing results of dynamic timing analyses for the circuit blocks existing inbetween the external input node and the simultaneous-varying inputted node pair.

A phase difference obtained in this manner should reflect a delay characteristic of the circuit block upstream of the subject circuit block, of which at least one exists.

Next, a method for further increasing the accuracy of the dynamic timing analysis will be described.

As described above, in the first delay characteristic analyzing system according to the invention, a net list is divided into a plurality of circuit blocks and a dynamic timing analysis is performed on each circuit block independently.

However, in a net list that represents a custom LSI, the circuit blocks are connected to each other inherently. Therefore, the delay characteristic of each circuit block should reflect influences of circuit blocks (hereinafter referred to as "downstream circuit blocks") that are connected to its output node(s).

A method for causing the delay characteristic of each circuit block to reflect influences of downstream blocks will be described.

Figure 13:
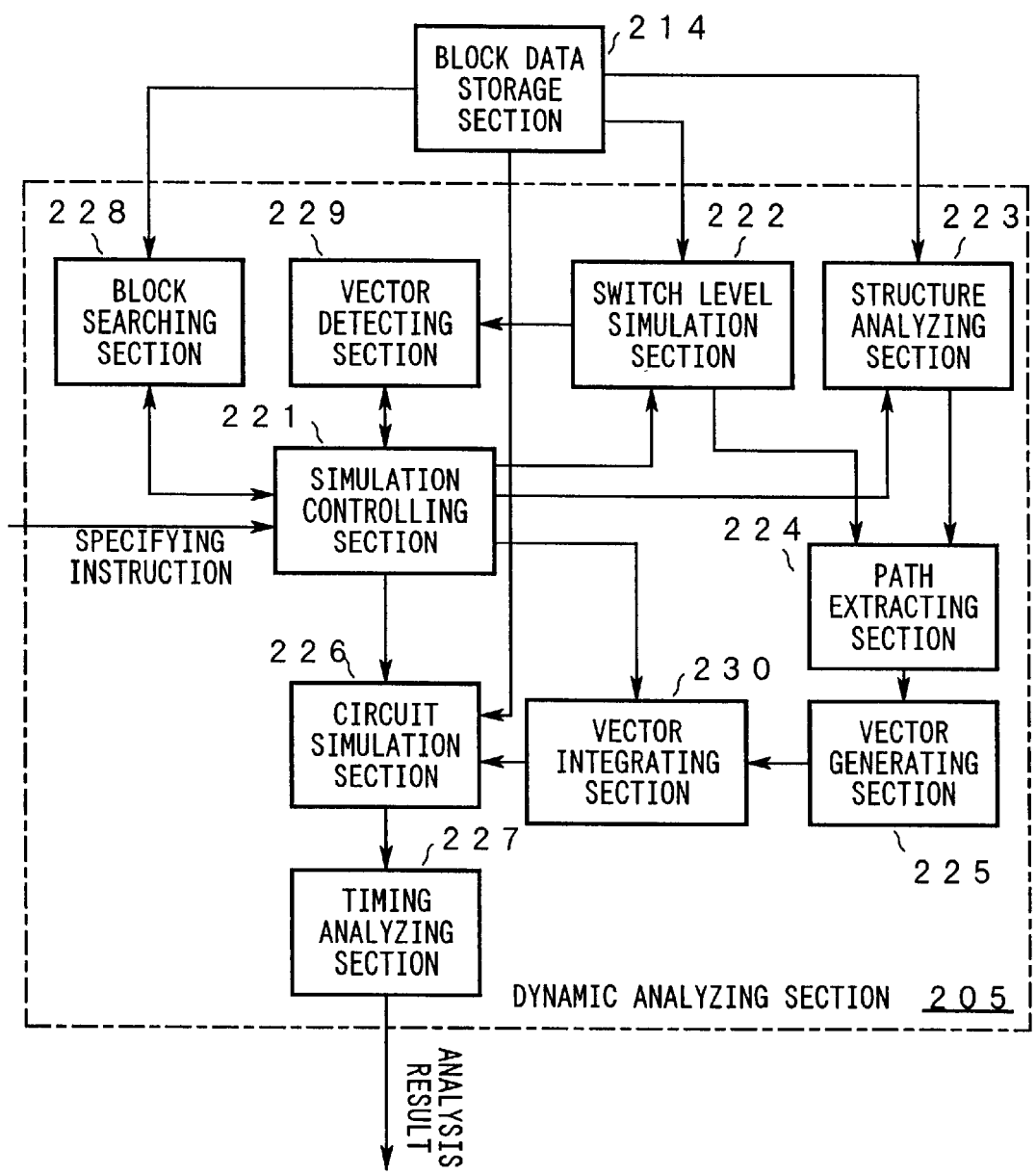
FIG. 13 shows a dynamic analyzing section according to a second embodiment of the present invention.
Figure 14:
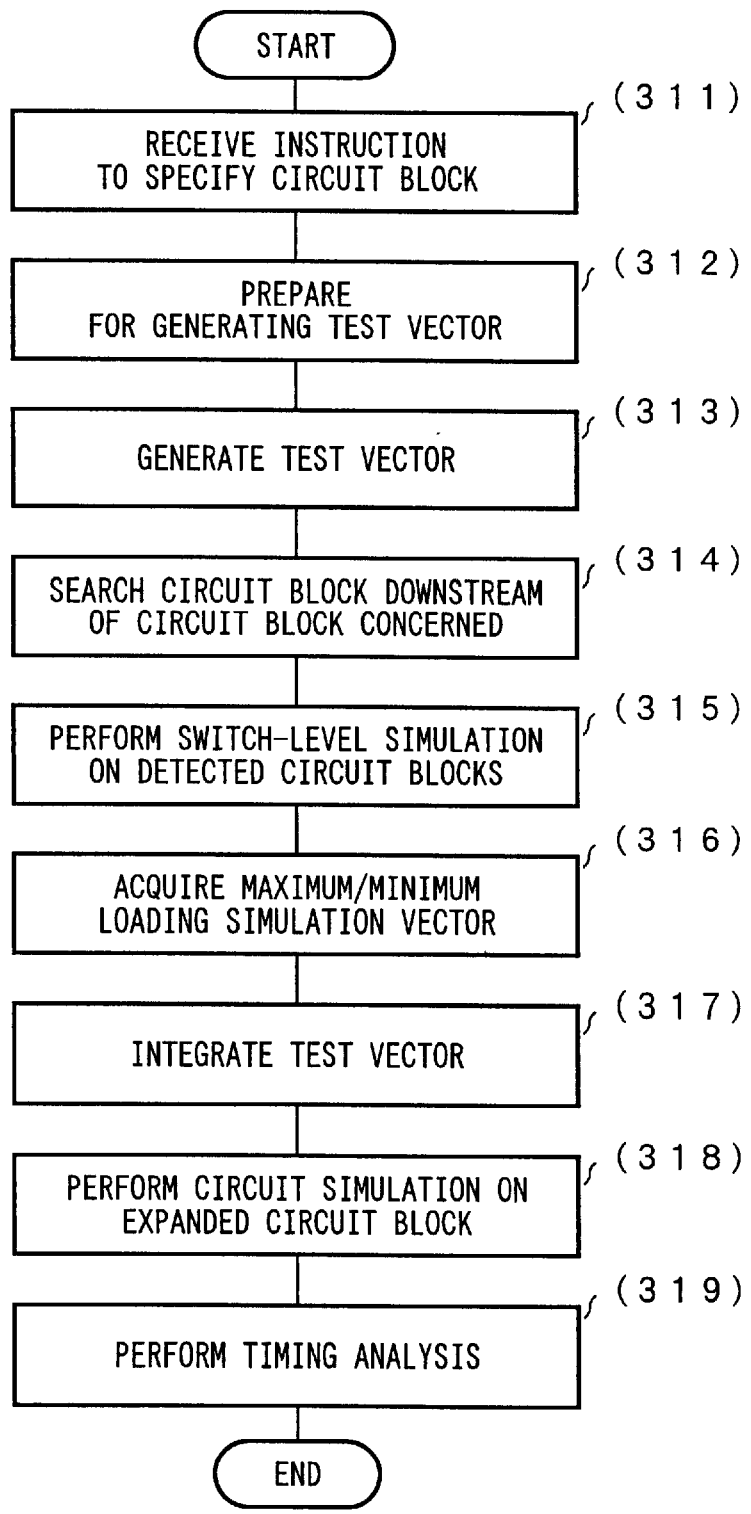
FIG. 14 is a flowchart showing a dynamic timing analysis.

FIG. 13 shows another dynamic analyzing section according to a second embodiment of the present invention. FIG. 14 is a flowchart showing a dynamic timing analysis.

As shown in FIG. 13, the dynamic analyzing section 206 has a block searching section 228, a vector detecting section 229, and a vector combining section 230 in addition to the sections shown in FIG. 11.

The block searching section 228 refers to the data stored in the block data storage section 214 and searches for circuit blocks that satisfy a condition specified by the simulation controlling section 221. A search result obtained is supplied to the switch level simulation section 222 via the simulation controlling section 221 and subjected to the processing of the switch level simulation section 222.

The vector detecting section 229 receives a simulation result from the switch level simulation section 222 in response to an instruction from the simulation controlling section 221, and detects a vector having a predetermined feature based on the received simulation result. A detection result, which is the vector, obtained is supplied to the vector combining section 230 via the simulation controlling section 221 and subjected to the processing of the vector combining section 230.

The vector combining section 230 shown in FIG. 13 receives not only the above-mentioned detection result of the vector detecting section 229 but also a test vector obtained by the vector generating section 225. A vector obtained by the vector combining section 230 is subjected to the processing of the circuit simulation section 226.

Next, the operation of this dynamic analyzing section 206 will be described.

When the dynamic analyzing section 206 receives an instruction that specifies circuit block to be dynamic-timing analyzed from the analysis controlling section 205 (see FIG. 7) (step 311), first the simulation controlling section 221 activates the processing of each of the switch level simulation section 222 and the structure analyzing section 223. In response, each of the switch level simulation section 222 and the structure analyzing section 223 performs preparatory processing for generating a test vector for the specified circuit block (step 312). Based on pieces of information obtained by the switch level simulation section 222 and the structure analyzing section 223, the path extracting section 224 and the vector gene rating section 225 generate a test vector for the specified circuit block (step 313).

Then, the simulation controlling section 221 activates the processing of the block searching section 228 while giving it a condition that each circuit block to be found should be connected to an output node of the circuit block to be analyzed. In response to the activation of processing, searching for downstream circuit blocks is performed (step 314). Data indicating circuit blocks detected by the search are passed to the switch level simulation section 222 via the simulation controlling section 221. In response to the input of data, the switch level simulation section 222 performs a switch level simulation for each of the downstream circuit blocks (step 315).

Based on analysis results obtained by the switch level simulations, the vector detecting section 229 detects, for each of the detected downstream circuit blocks, a combination of input signals that cause a maximum number of transistors in which a source-drain potential variation has occurred and a combination of input signals that cause a minimum number of transistors in which a source-drain potential variation has occurred. The first combination corresponds to a maximum loading simulation vector that maximizes the load as viewed from the subject circuit block and the latter combination corresponds to a minimum loading simulation vector that minimizes it, respectively (step 316). The detected combinations of input signals are supplied to the vector combining section 230 via the simulation controlling section 221 and subjected to the processing of the vector combining section 230.

Figure 15:
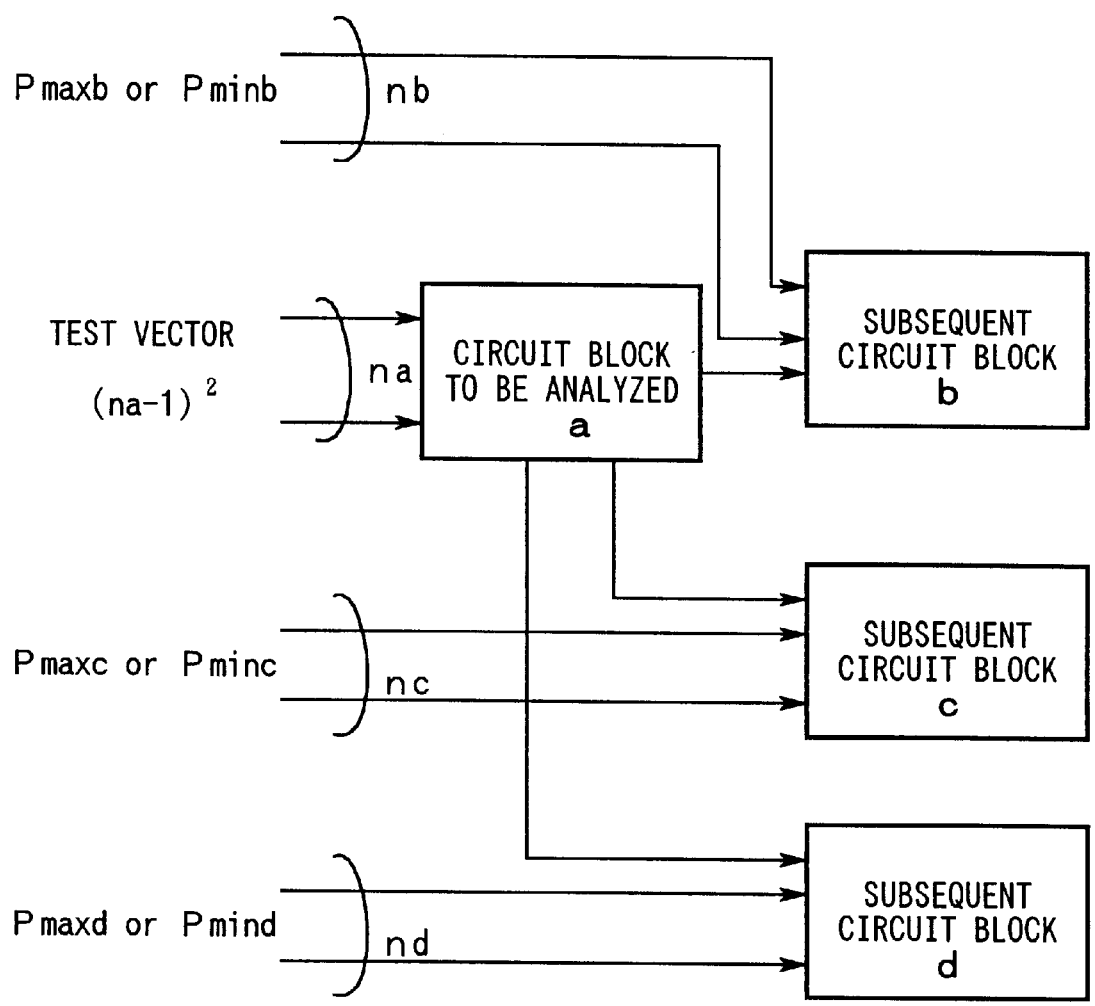
FIG. 15 illustrates an electrical circuit simulation on a circuit including downstream circuit blocks.

By performing, as shown in FIG. 15, an electrical circuit simulation on the subject circuit block (denoted by symbol "a" in FIG. 15) in a state that the subject block a is coupled to downstream circuit blocks (denoted by symbols "b," "c," and "d" in FIG. 15), a delay characteristic can be determined while influences of the downstream circuit blocks b–d are taken into account.

If the vector combining section 230 combines maximum loading simulation vectors (represented by symbols "Pmaxb," "Pmaxc," and "Pmaxd" in FIG. 15) or minimum loading simulation vectors (represented by symbols "Pminb," "Pminc," and "Pmind" in FIG. 15) obtained for the respective downstream circuit blocks b–d with a test vector generated for the circuit block a (step 317), the electrical circuit simulation on the subject circuit block a can be performed in a state that the output load as viewed from the subject circuit block a is fixed at a maximum or minimum value (step 318).

With the above measure, the number of test vectors can be made much smaller than in a case where test vectors are generated in numbers corresponding to the numbers nb, nc, and nd of input nodes of the respective downstream circuit blocks b–d. In addition, the above-obtained maximum loading simulation vectors and minimum loading simulation vectors give maximum values and minimum values of influences of the respective downstream circuit blocks on the subject circuit block. Therefore, by performing an electrical circuit simulation on the circuit including the downstream circuit blocks in the above-described manner and performing a dynamic timing analysis based on its result (step 319), a delay characteristic of the subject circuit block that reflects the influences of the downstream circuit blocks can be determined with very high accuracy in a much shorter time than in a case where test vectors are generated automatically for also the downstream circuit block.

Next, a method for shortening the time necessary for a dynamic timing analysis on each circuit block will be described.

Figure 16:
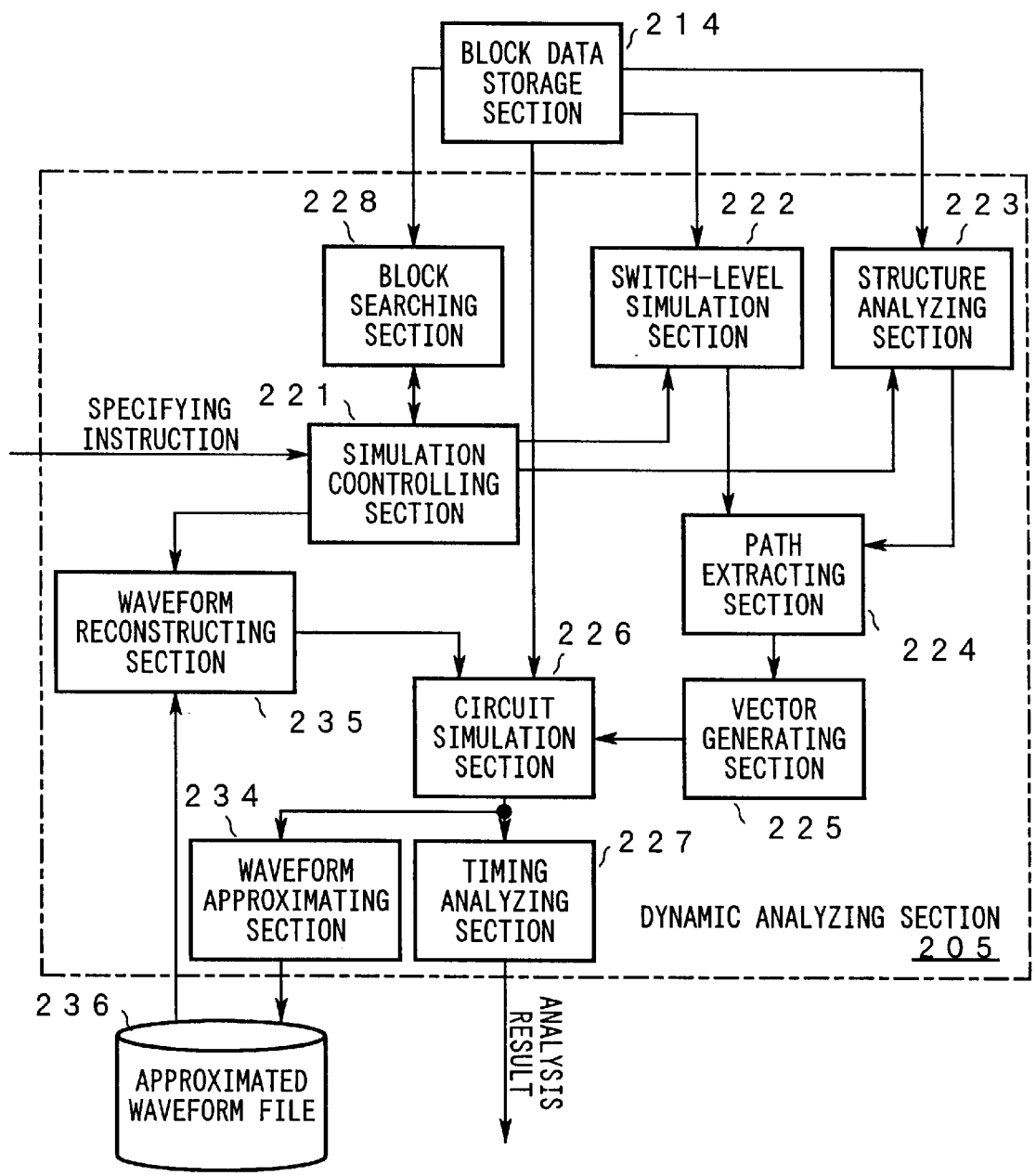
FIG. 16 shows another dynamic analyzing section according to a third embodiment of the present invention.

FIG. 16 shows another dynamic analyzing section according to a third embodiment of the present invention.

As shown in FIG. 16, the dynamic analyzing section 206 has the block searching section 228 (described above), a waveform approximating section 234, and a waveform reconstructing section 235 in addition to the sections shown in FIG. 11.

The waveform approximating section 234 has a function of generating an approximated waveform having a feature of an output signal for each output node of a circuit block as a subject of analysis based on a simulation result obtained by the circuit simulation section 226.

Waveform data representing the approximated waveforms obtained by the waveform approximating section 234 are stored in an approximated waveform file 236 upon their generation.

The waveform reconstructing section 235 has a function of reading out a desired waveform data from the approximated waveform file 236 in response to an instruction from the simulation controlling section 221, reconstructing an approximated waveform from the read-out waveform data, and subjecting the approximated waveform to the processing of the circuit simulation section 226.

Figure 17:
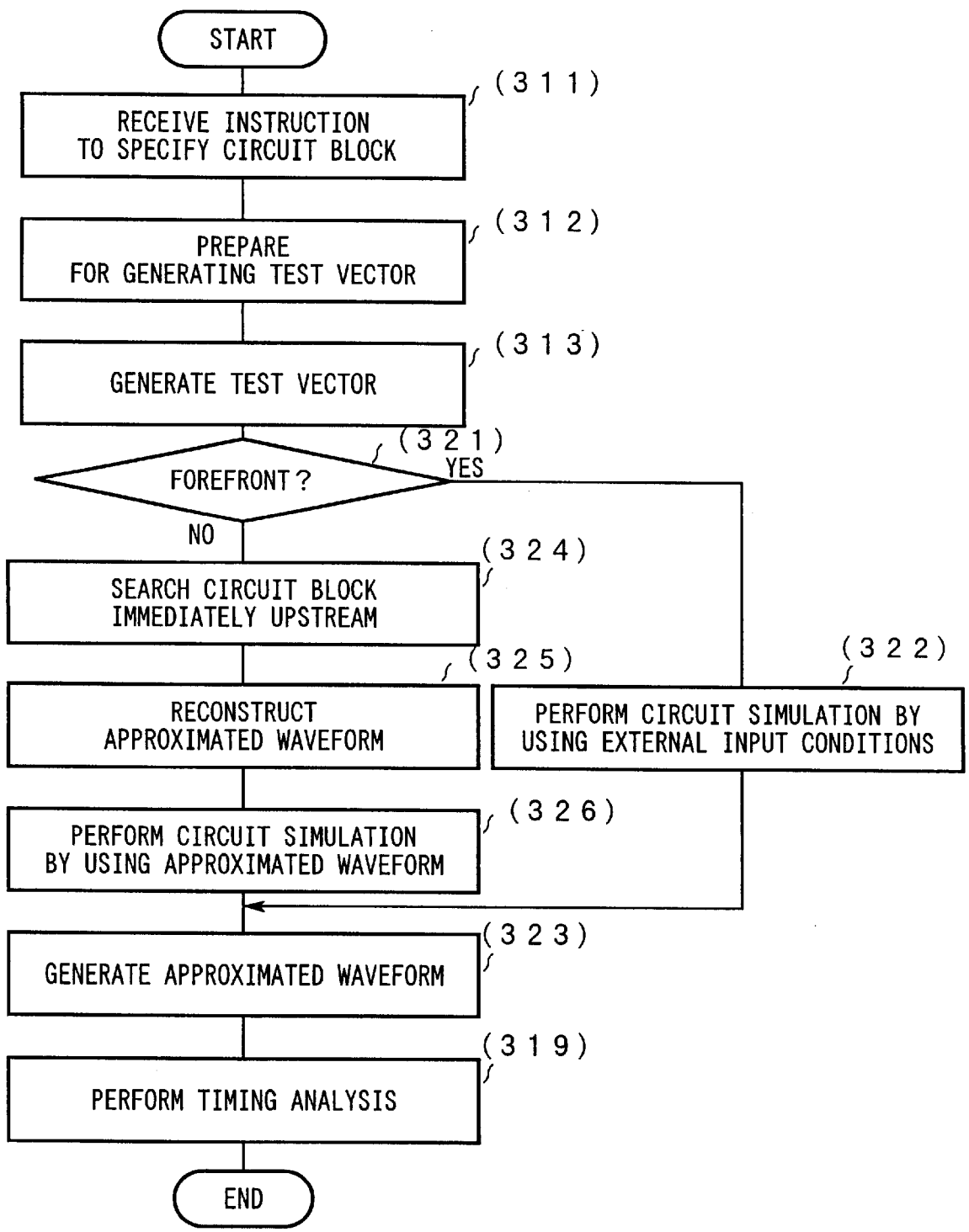
FIG. 17 is a flowchart showing a dynamic timing analysis.

A dynamic timing analysis performed by the dynamic analyzing section 206 of FIG. 16 will be described below. FIG. 17 is a flowchart showing the dynamic timing analysis.

First, in response to specification of a circuit block, preparations for test vector generation are made in the same manner as in steps 311–313 in FIG. 14. A test vectors is generated by the vector generating section 225.

Then, the simulation controlling section 221 judges whether the circuit block as the subject of analysis is the forefront one (step 321).

For example, if all the input nodes of the subject circuit block are connected to external input terminals of the custom LSI, the simulation controlling section 221 judges that the subject circuit block is the foremost one (the judgment result at step 321 is affirmative). In this case, in response to an instruction from the simulation controlling section 221, the circuit simulation section 226 performs an electrical circuit simulation on the subject circuit block using conditions relating to external input signals (step 322). Obtained simulation results are subjected to the processing of the waveform approximating section 234.

Figure 18:
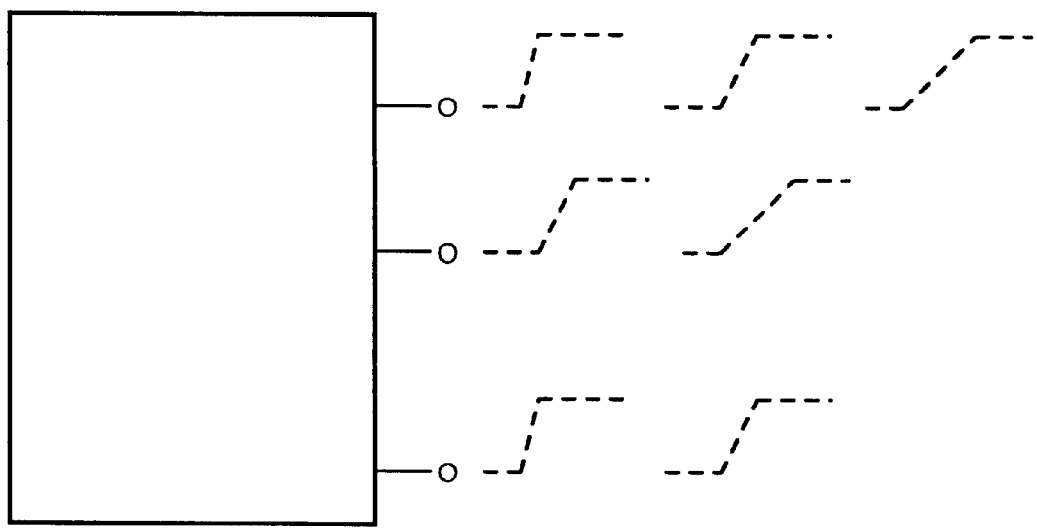
FIGS. 18A and 18B illustrate an approximated waveform.
Figure 18:
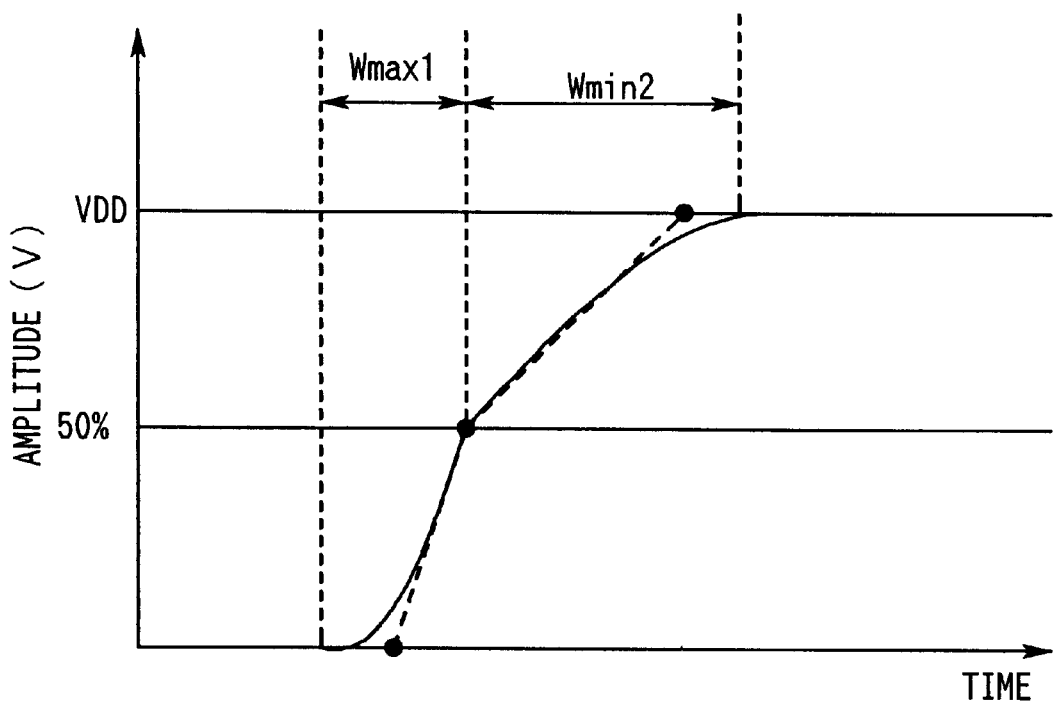

FIGS. 18A and 18B illustrate an approximated waveform.

As shown in FIG. 18A, simulation results obtained by the circuit simulation section 226 include various output signal waveforms that are output from the output nodes of the subject circuit block in response to input of various test vectors.

At step 323 in FIG. 17, first, the waveform approximating section 234 analyzes output signal waveforms obtained at the output nodes and extracts output signal waveforms having maximum or minimum slew rates, respectively, for each output node. Then, the waveform approximating section 234 divides the output signal waveforms extracted for each output node at the level of half (50%)-amplitude, and, as shown in FIG. 18B, combines the first half of the rising edge of the output signal waveform (Wmax 1 in the Figure) having the maximum slew rate with the second half of the rising edge of the output signal waveform (Wmin 2 in the Figure) having the minimum slew rate. Further, the waveform approximating section 234 converts the combined waveform into a polygonal-line waveform (indicated by the broken line in FIG. 18B) and stores data indicating three points (indicated by symbols "a," "b," and "c" in FIG. 18B) that determine the waveform in the approximated waveform file 236 as waveform data. Step 323 in FIG. 17 is finished here.

Then, the timing analyzing section 227 performs a timing analysis in the same manner as at step 319. The dynamic timing analysis on this circuit block is finished here.

On the other hand, if the judgment result at step 321 is negative, the simulation controlling section 221 activates the processing of the block searching section 228 while giving it a condition that each circuit block to be found should be connected to an input node of the circuit block to be analyzed in response to the activation of processing, searching for upstream circuit blocks is performed (step 324).

Data indicating circuit blocks detected by the search are passed to the waveform reconstructing section 235 via the simulation controlling section 221. In response to the input of data, the waveform reconstructing section 235 reads out the waveform data stored in the approximated waveform file 236 which satisfy a predetermined condition, and reconstructs approximated waveforms based on the respective waveform data (step 325).

At this time, the waveform reconstructing section 235 reads out waveform data corresponding to an output node of each upstream circuit block that is connected to an input node of the subject circuit block, and reconstructs an approximated waveform as shown in FIG. 18B based on the read-out waveform data.

The approximated waveforms reconstructed in this manner are passed to the circuit simulation section 226, which performs an electrical circuit simulation using those approximated waveforms (step 326).

Each approximated waveform (see FIG. 18B) obtained in the above manner reflects both a feature of an output signal having a maximum slew rate and a feature of an output signal having a minimum slew rate, and the maximum and minimum slew rates are important indices for evaluation of the delay characteristic of the circuit block. Therefore, by using, as input signal waveforms, the approximated waveforms obtained for the respective upstream circuit blocks, an electrical circuit simulation on the subject circuit block can be performed under approximately the same conditions as it is connected to the upstream circuit blocks. This makes it possible to obtain a simulation result taking in account the position of the subject circuit block in the custom LSI, to thereby increase the accuracy of a dynamic timing analysis on each circuit block.

The above-described approximated waveform is a polygonal-line waveform that is determined by only three points. Therefore, the data amount can be made much smaller than in a case where a combined waveform itself as indicated by the thin solid line in FIG. 18B is used as an input signal waveform; a remarkable effect on increasing the speed of the electrical circuit simulation is expected.

Further, as shown in FIG. 18B, the approximated waveform is very faithful to a corresponding combined waveform, the decrease in accuracy due to approximation is very small.

Therefore, a highly accurate simulation result can be obtained at high speed by performing an electrical circuit simulation on a subject circuit block using approximated waveforms of the above kind as input signal waveforms.

Figure 25:
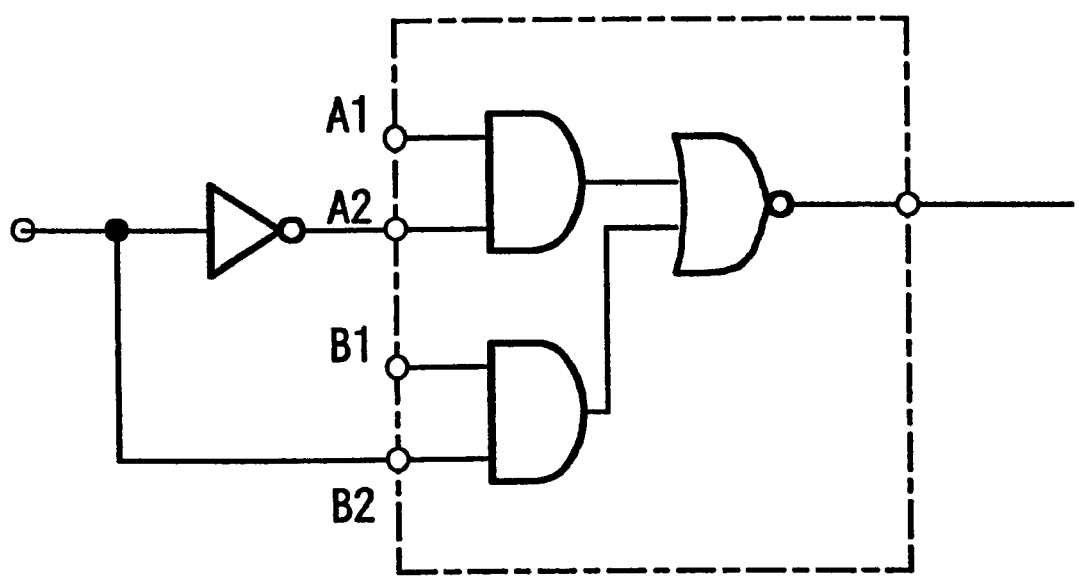
FIG. 25 illustrates invalid paths.

Next, a description will be made of a measure to be taken when it is found that a combination of invalid signals is included in a test vector after formation of a delay characteristic library in an electrical circuit simulation on the circuit block consisting of logic circuits shown in FIG. 25, for example.

Figure 19:
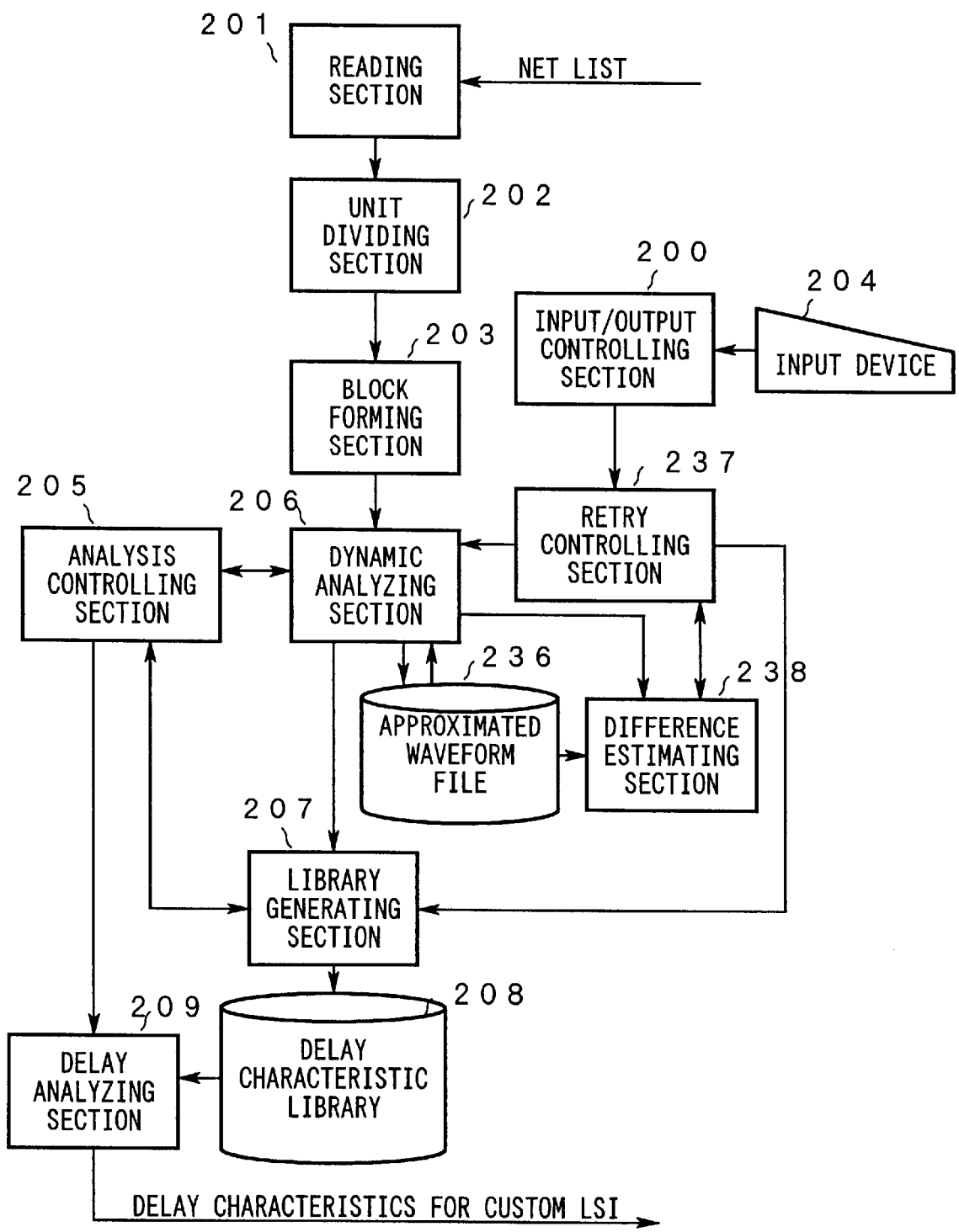
FIG. 19 shows an embodiment of a second delay characteristic analyzing system according to the present invention.

FIG. 19 shows an embodiment of a second delay characteristic analyzing system according to the invention.

The second delay characteristic analyzing system is configured in such a manner that a retry controlling section 237 and a difference estimating section 238 are added to the delay characteristic analyzing system of FIG. 7. As shown in FIG. 19, the dynamic analyzing section 206 has a configuration that is equivalent to the configuration of the third embodiment shown in FIG. 16. Waveform data for respective analyzed circuit blocks are stored in the approximated waveform file 236.

Referring to FIG. 19, a predetermined instruction that is input through the input device 204 is passed to the retry controlling section 237 via the input/output controlling section 200. In response to the instruction, the retry controlling section 237 controls the operation of the dynamic analyzing section 206, whereby retry of a dynamic timing analysis is started.

When receiving an analysis result obtained by the retried dynamic timing analysis, the difference estimating section 238 estimates the magnitude of a difference based on this newly obtained analysis result and the previous analysis result that is indicated by a waveform data stored in the approximated waveform file 236.

Based on a result of the estimation, the retry controlling section 237 judges whether to employ the new analysis result. A delay characteristic library reconstruction processing (described later) is activated depending on the judgment result.

Figure 20:
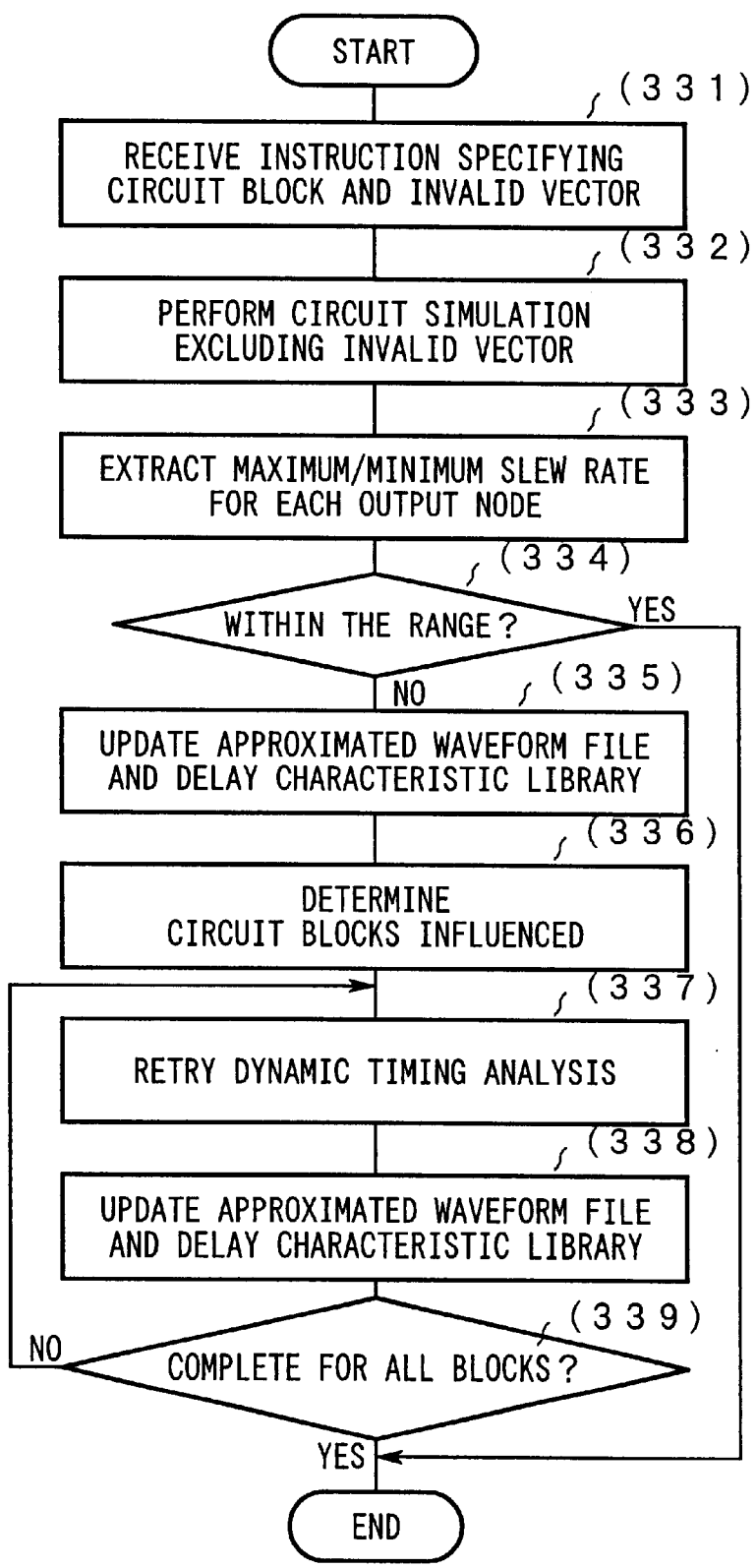
FIGS. 20 is a flowchart showing retry of a dynamic timing analysis and delay characteristic library reconstruction processing.
Figure 21:
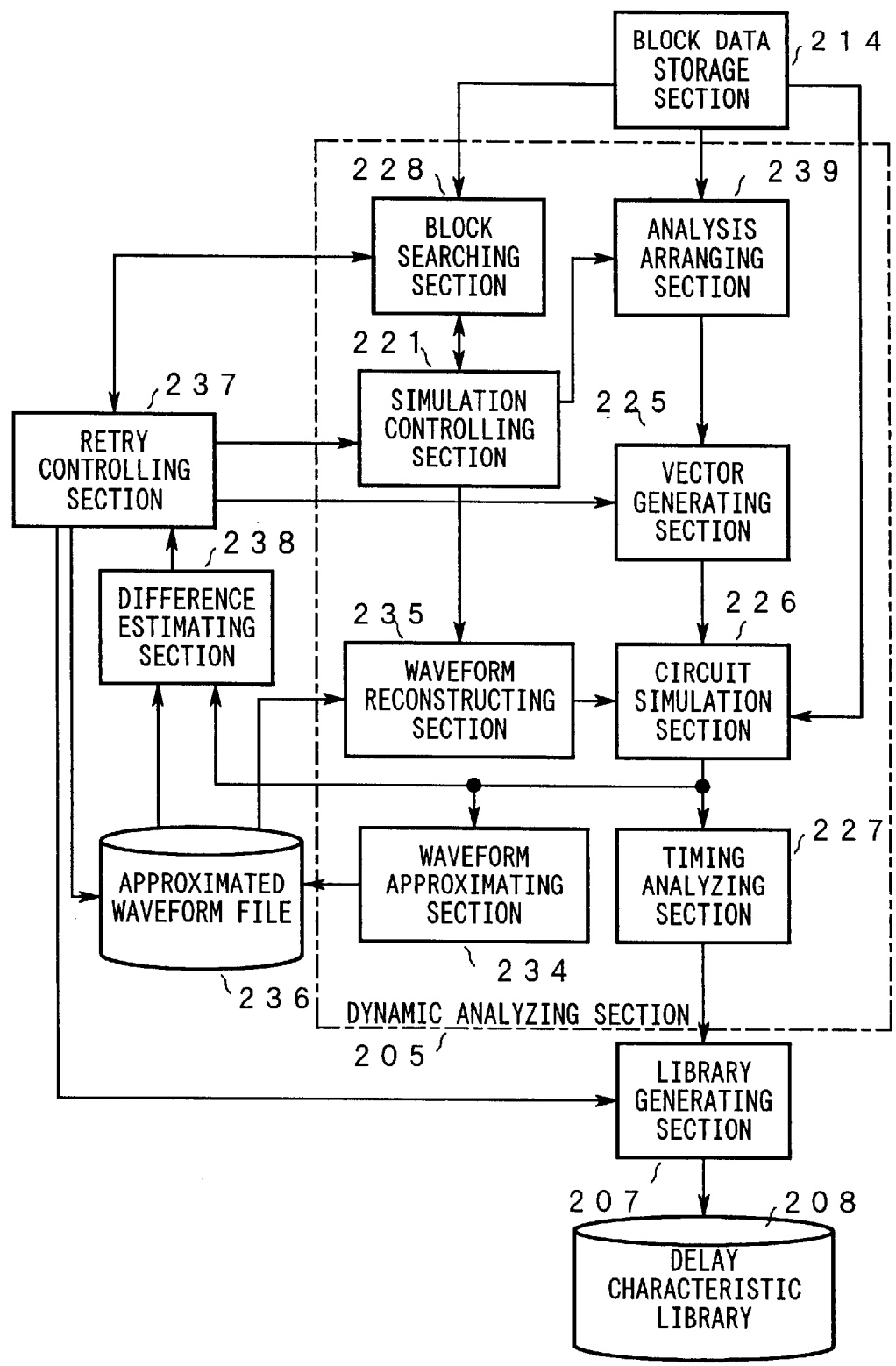
FIG. 21 is a block diagram showing retry of a dynamic timing analysis and delay characteristic library reconstruction processing.

FIGS. 20 and 21 are a flowchart and a block diagram, respectively, showing the retry of a dynamic timing analysis and the delay characteristic library reconstruction processing.

When a retry instruction containing information that specifies a circuit block on which an electrical circuit simulation was performed by using a combination of invalid input signals and the invalid input signals is input to the input/output controlling section 200 through the input section 204, the retry instruction is accepted by the retry controlling section 237 (step 331). First, a dynamic timing analysis on the circuit block concerned is started.

At this time, the retry controlling section 237 passes data identifying the specified circuit block to the simulation controlling section 221 as information indicating the circuit block to be analyzed. In response, a dynamic timing analysis on this circuit block is started again.

First, in response to an instruction from the simulation controlling section 221, an analysis arranging section 239 performs preparatory processing for execution of an electrical circuit simulation on the circuit block concerned. The analysis arranging section 239 is composed of the switch level simulation section 222, the structure analyzing section 223, and the path extracting section 224 shown in FIG. 16, and plays roles that are equivalent to the roles that are played by those sections in the dynamic analyzing section 206 shown in FIG. 16. An analysis result indicating valid paths is subjected to the processing of the vector generating section 225.

On the other hand, the data identifying the invalid input signals are passed from the retry controlling section 237 to the vector generating section 225 and the invalid input signals are used, for example, an inhibit vector that is inhibited from being output to the circuit simulation section 226. In response to the input of data, the vector generating section 225 generates a test vector that does not include the specified invalid input signals. The circuit simulation section 226 performs an electrical circuit simulation using the generated test vector (step 332). At this time, the electrical circuit simulation is performed by using approximated waveforms obtained for respective upstream circuit blocks in the same manner as at steps 324–326 in FIG. 17.

A simulation result obtained in this manner is passed to the difference estimating section 238. First, the difference estimating section 238 analyses output signals of each output node and extracts a maximum slew rate and a minimum slew rate from those output signals (step 333).

Then, the difference estimating section 238 compares the slew rate range indicated by the maximum and minimum slew rates extracted for each output node with that indicated by waveform data stored in the approximated waveform file 236 as one corresponding to the output node, and thereby judges whether the difference between the new analysis result and the previous one is within an allowable range.

If the difference estimating section 238 obtains, for every output node, an estimation result that the newly extracted slew rate range is within the range indicated by the corresponding waveform data (the judgment result at step 334 is affirmative), the retry controlling section 237 judges that the influences of the invalid input signals on the previous dynamic timing analysis result are negligible and the retry processing is finished.

On the other hand, if the judgment result at step 334 is negative, the retry controlling section 237 judges that the influences of the invalid input signals on the previous dynamic timing analysis result are not negligible and activates the delay characteristic library reconstruction processing.

First, in response to the activity instruction from the retry controlling section 237, the waveform approximating section 234 writes newly obtained waveform data to the approximated waveform file 236 so as to be correlated with the corresponding circuit block concerned. The library generating section 207 evaluates a delay characteristic of the circuit block based on the newly obtained analysis result. A newly obtained delay characteristic is registered as an element of the delay characteristic library 208 corresponding to the circuit block concerned (step 335).

Then, the retry controlling section 237 activates the operation of the block searching section 228, and the block searching section 228 searches for circuit blocks to which an output signal of the specified circuit block is input directly or indirectly until an external output node is reached, whereby the range that is influenced by the variation in the delay characteristic of the specified circuit block is determined (step 336).

Based on results of the above search, the retry controlling section 237 designates, to the simulation controlling section 221, each circuit block included in the influenced range as a circuit block to be analyzed. In response to the designation of the circuit block, a dynamic timing analysis equivalent to the one performed at step 332 is performed again on the circuit block (step 337).

The contents of the approximated waveform file 236 and the delay characteristic library 208 are updated based on the analysis result obtained by the dynamic timing analyses (step 338).

The above steps 337 and 338 are repeatedly executed for all the circuit blocks included in the influenced range to complete the retry of the dynamic timing analysis and the regeneration of the delay characteristic library 208. When the retry of the dynamic timing analysis and the updating of the approximated waveform file 236 and the delay characteristic library 208 have been completed for all the circuit blocks included in the influenced range, the retry controlling section 237 then judges that the processing has completed for all the circuit blocks (the judgment result at step 339 is affirmative). The dynamic timing analysis and the delay characteristic library reconstruction are finished here.

In this manner, a dynamic timing analysis is retried, independently, under a desired condition, on a specified circuit block and circuit blocks included in such a range as to be influenced by the specified circuit block, whereby the registration contents of the delay characteristic library can be altered in accordance with analysis results.

In doing so, the subjects of the retry of the dynamic timing analysis are limited to the specified circuit block and the set of circuit blocks to which an output signal of the specified circuit block is input directly or indirectly, and hence the time that is necessary for the retry of the dynamic timing analysis and the delay characteristic library reconstruction can be restricted to a practically allowable range. The delay characteristics of a number of circuit blocks that are not included in the influenced range can be used as they are.

With the above measure, for example, even when invalid input signals are found during the course of a static timing analysis, adaptation can be made quickly by reconstructing a correct delay characteristic library consisting of delay characteristics obtained by using only valid input signals with a static timing analysis again. This advantage is never obtained by the conventional technique that handles the entire net list as an undividable thing, and can be made enjoyable only by the basic feature of the invention that a net list representing a custom LSI is divided into circuit blocks and a delay characteristic library is constructed based on results of dynamic timing analyses performed independently on those circuit blocks.

Further, as described above, approximated waveforms are generated based on output signal waveforms obtained by an electrical circuit simulation during the course of a first dynamic timing analysis on each circuit block, and are stored in the approximated waveform file 236. Therefore, approximated waveforms of upstream circuit blocks can be used as input signal waveforms in retrying an electrical circuit simulation irrespective of the position of a specified circuit block in the custom LSI. This makes it possible to obtain, in retry of a dynamic timing analysis, an analysis result with the same accuracy as in the first analysis.

Further, since each waveform data stored in the approximated waveform file 236 reflects a maximum slew rate and a minimum slew rate of output signals that were obtained by a previous electrical circuit simulation, it is possible to correctly judge whether a difference in a simulation result that is caused by elimination of invalid input signals is allowable, by comparing the slew rate range indicated by the waveform data with that of newly obtained output signals in the above described manner.

In developmental designing of a custom LSI, there frequently occurs a case that part of a net list on which delay characteristic analysis has already been completed is changed to obtain desired performance. A description will now be made of a method for performing a delay characteristic analysis at high speed when part of a net list has been changed.

Figure 22:
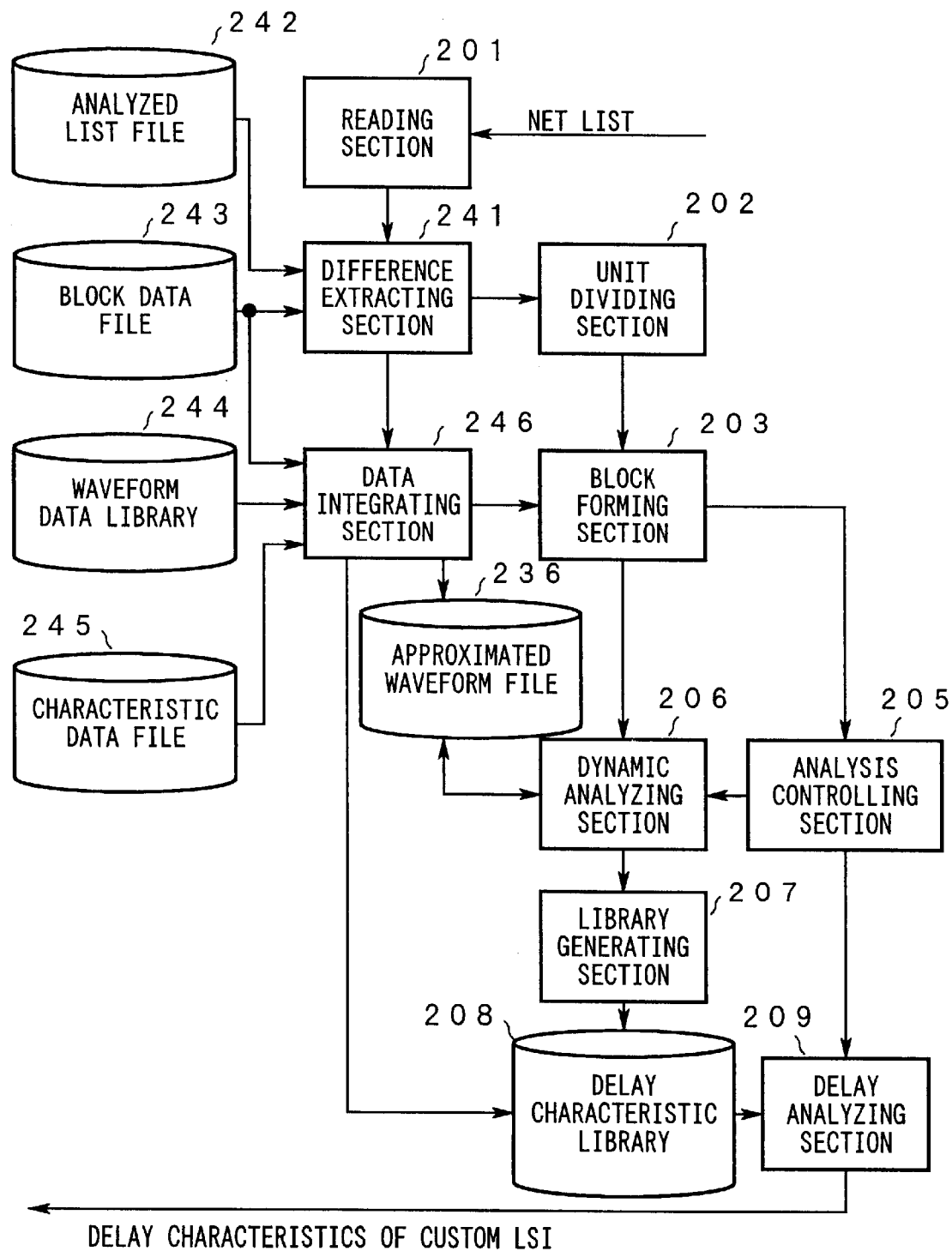
FIG. 22 shows an embodiment of a third delay characteristic analyzing system according to the present invention.

FIG. 22 shows an embodiment of a third delay characteristic analyzing system according to the invention.

The third delay characteristic analyzing system of FIG. 22 is configured in such a manner that a difference extracting section 241 and a data integrating section 246 are added to the first delay characteristic analyzing system of FIG. 7.

Referring to FIG. 22, an old net list on which delay characteristic analysis has already been completed is stored in an analyzed list file 242 and block data relating to circuit blocks that were formed in performing delay characteristic analysis on the old net list are stored in a block data file 243.

The old net list and the block data relating to the old net list are subjected to the processing of the difference extracting section 241. The difference extracting section 241 compares a net list that has newly been read by the reading section 201 with the old net list, for every circuit element, to extract circuit elements substituted in the change of engineering the old net list and a circuit range that is influenced by the change as the difference between the net lists, and provides the difference between the net lists to the processing of the unit dividing section 202. On the other hand, the difference extracting section 241 passes information relating to the range that remains the same as in the old net list to the data integrating section 246.

Waveform data representing approximated waveforms that were generated in performing delay characteristic analysis on the old net list are stored in a waveform data library 244. On the other hand, delay characteristics that were registered in the delay characteristic library 208 so as to be correlated with respective circuit blocks constituting the old net list are stored in a characteristic data file 245. The waveform data stored in the waveform data library 244, the characteristic data stored in the characteristic data file 245, and the above-mentioned block data are subjected to the processing of the data integrating section 246, and are used for generation of data to be stored in the approximated waveform file 236, the delay characteristic library 208, and the block data storage section 214 (see FIG. 7), respectively.

Figure 23:
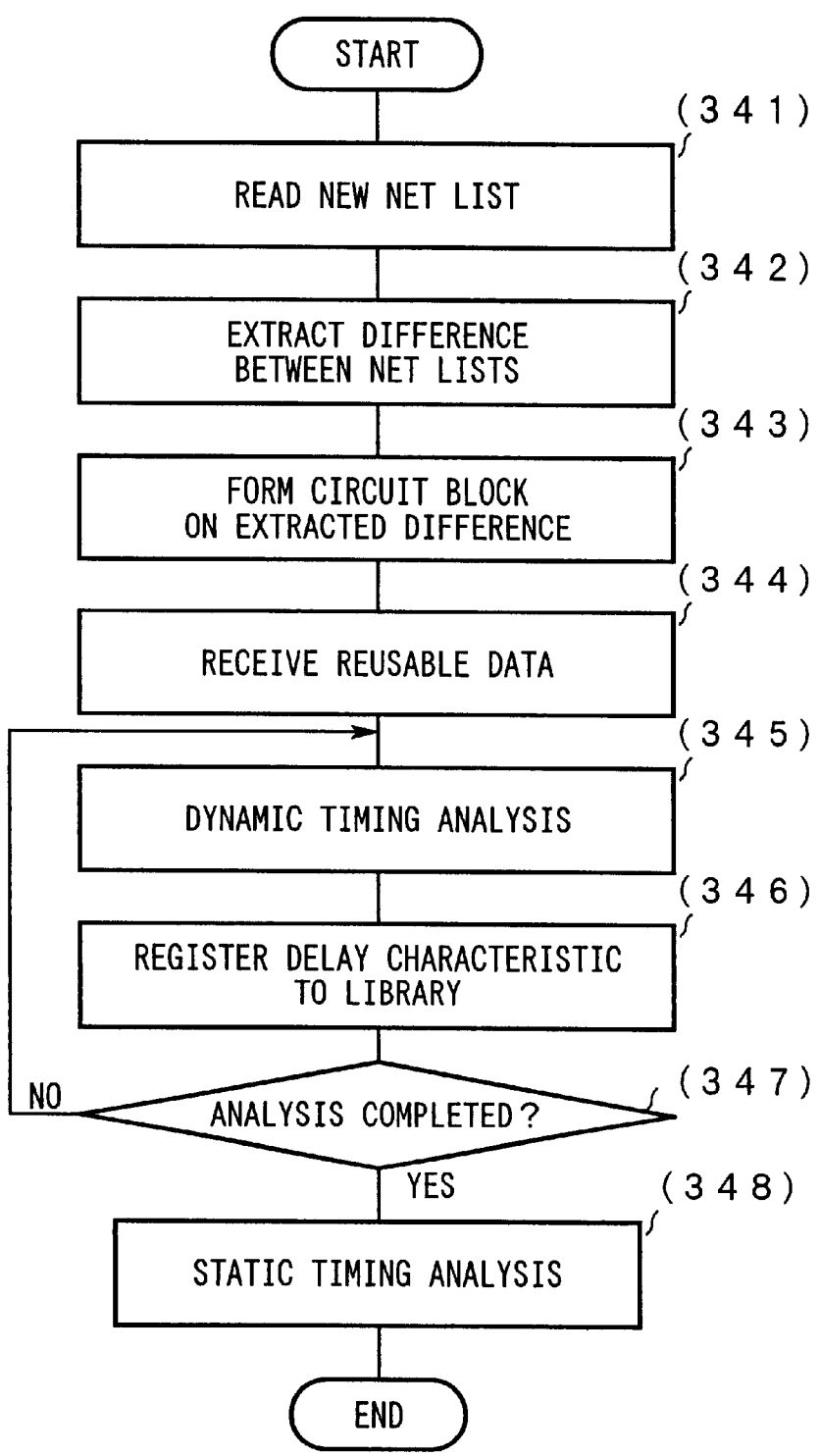
FIG. 23 is a flowchart showing delay characteristic analysis performed by the third delay characteristic analyzing system according to the present invention.

The operation of the third delay characteristic analyzing system will be described below. FIG. 23 is a flowchart showing delay characteristic analysis performed by the third delay characteristic analyzing system.

When a new net list is obtained by changing part of a delay-characteristic analyzed net list and is read by the reading section 201 (step 341), the difference extracting section 241 compares the thus-read net list with the old net list that is stored in the analyzed net file 242 and thereby extracts, as a difference between the net lists, a net list range where the circuit blocks of the old net list cannot be used as the circuit blocks of the new net list due to the portion that is changed from the old net list (step 342). The difference between the net lists is divided into unit cells by the unit dividing section 202. Unit cells are subjected to the processing of the block forming section 203 and thereby converted into circuit blocks that satisfies the above-described conditions (step 343).

Block data of each of the thus-obtained circuit blocks including the changed portion is stored in the block data storage section 214 (see FIG. 7) after a flag to the effect it is a subject of analysis is added to it.

Then, the data integrating section 246 selectively reads reusable part of the data that were obtained by respective pieces of processing of the delay characteristic analysis on the old net list (step 344).

Figure 24:
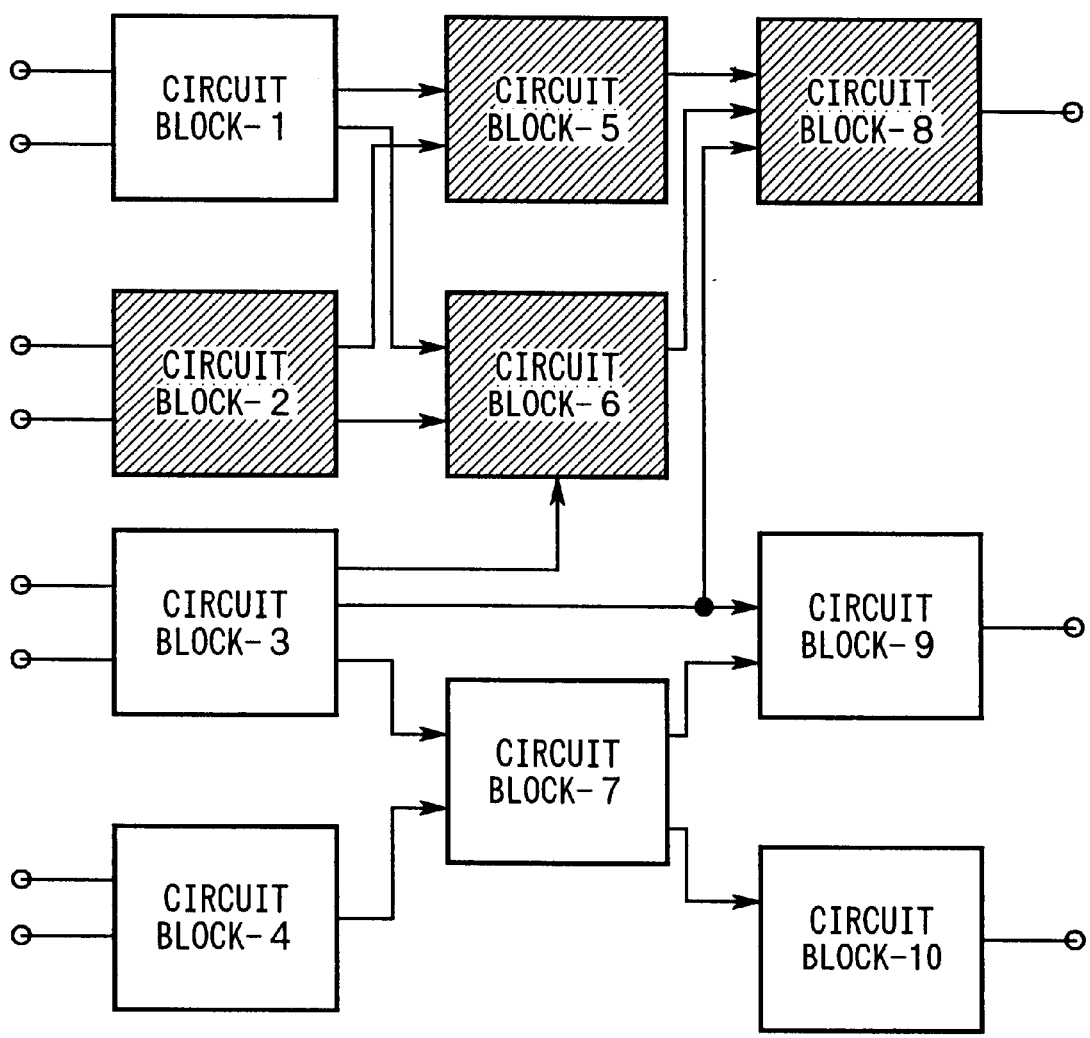
FIG. 24 shows a difference between net lists.

For example, if the difference extracting section 241 judges that as shown in FIG. 24 the difference between the net lists is the range that has been converted into a new circuit block-2 and that circuit blocks of the old net list can be used as the other circuit blocks, the data integrating section 246 reads out block data that are stored in the block data file 243 as ones corresponding to a circuit block-1 and a circuit block-3 to a circuit block-10 and stores, for reuse, those in the block data storage section 214 (see FIG. 7) that is provided inside the block forming section 203. At this time, the data integrating section 246 judges, for each circuit block, whether it receives an output signal of the new circuit block directly or indirectly. For each of the circuit blocks (hatched in FIG. 24) for which the judgment result is affirmative, corresponding block data is stored in the block data storage section 214 after a flag that indicates a subject of analysis to the block data is added to it.

On the other hand, for each of the circuit blocks for which it has been judged that it is not influenced by the new circuit block, the data integrating section 246 reads out corresponding waveform data and delay characteristic data from the waveform data library 244 and the characteristic data file 245, respectively, and writes those to the approximated waveform file 236 and the delay characteristic library 208, respectively. And then data integrating section 246 stores those data to the approximated waveform file 236 and the delay characteristics library 208 in association with each circuit block to allow the waveform data and the delay characteristic data to be used in respective processes upon the corresponding circuit block.

After the processing of integrating the reusable data has completed, it is proper for the analysis controlling section 205 to sequentially designate circuit blocks to be analyzed to the dynamic analyzing section 206 based on the flags that are stored in the block data storage section 214 together with the block data, and to activate dynamic timing analysis on each of those circuit blocks.

In response to the designation of the circuit block, the dynamic analyzing section 206 performs a dynamic timing analysis on the circuit block (step 345). Based on the obtained analysis result, the library generating section 207 generates a delay characteristic for the circuit block concerned and registers a delay characteristic that has been obtained for the circuit block concerned in the delay characteristic library 208 (step 346).

Since the waveform data corresponding to the circuit block-1 and the circuit block-3 shown in FIG. 24 was stored in the approximated waveform file 236 in the above-described data integrating processing, an electrical circuit simulation can be performed by using waveform data that was stored in the approximated waveform file 236 in association with the upstream circuit blocks on each of the circuit block-5, the circuit block-6, and the circuit block-8. This makes it possible to obtain an electrical circuit simulation result quickly with high accuracy in the same manner as in a case of performing new delay characteristic analysis.

After the dynamic timing analysis and the delay characteristic library generation have completed for all the circuit blocks that are stored in the block data storage section 214 together with the flags that indicate subjects of analysis (the judgment result at step 347 is affirmative), the analysis controlling section 205 starts a static timing analysis by the delay analyzing section 209.

Since as described above the reusable delay characteristics obtained by the delay characteristic analysis on the old net list have already been registered in the delay characteristic library 208 by the data integrating section 246, a delay characteristic library 208 containing delay characteristics of all the circuit blocks constituting the custom LSI that is indicated by the new net list is completed by registering additionally a delay characteristic corresponding to the circuit block to be analyzed in the delay characteristic library 208.

Therefore, a delay characteristic of the entire custom LSI can be estimated by causing the delay analyzing section 209 to perform a static timing analysis using the delay characteristic library 208 thus completed (step 348).

As described above, in performing delay characteristic analysis on a new net list obtained by changing part of an old net list, very few circuit blocks are processed by the dynamic timing analysis and the delay characteristic library generation. This is because the circuit block to be subjected are limited to circuit blocks including a portion that is changed from the old net list and circuit blocks that are included in a range that is influenced by the delay characteristics of the circuit blocks including the changed portion of the old net list, whereby the time necessary for the total delay characteristic analysis can be shortened.

The invention is not limited to the above embodiments and various modifications may be made without departing from the spirit and scope of the invention. Any improvement may be made in part or all of the components.

What is claimed is:

1. A delay characteristic analyzing method comprising:
   reading a net list that indicates an arrangement of and a connection between transistors and circuit elements equivalent to transistors;
   dividing a circuit to be analyzed, which is indicated by the net list, into unit cells each being a minimum of which can operate as a logic circuit;
   forming a plurality of circuit blocks by coupling together said unit cells according to a predetermined condition and the connection that is indicated by the net list;
   performing a dynamic timing analysis on each of said circuit blocks by performing an electrical circuit simulation under a condition of inputting a combination of proper input signals to the circuit blocks;
   generating a delay characteristic library including delay characteristics of said circuit blocks, based on results of said electrical circuit simulations on each of the circuit blocks; and
   performing a transmission delay analysis on a desired signal path by performing a static timing analysis based on said delay characteristic library by considering the circuit to be analyzed, which is indicated by the net list, and to be structured by the circuit blocks.

2. The delay characteristic analyzing method according to claim 1, wherein said coupling of unit cells is controlled under a condition that the number of unit cells included in each circuit block is smaller than or equal to a predetermined threshold value when forming a plurality of circuit blocks.

3. The delay characteristic analyzing method according to claim 1, wherein said coupling of unit cells is controlled under a condition that each circuit block includes at least one transistor that is connected to a power supply terminal or a ground terminal when forming a plurality of circuit blocks.

4. The delay characteristic analyzing method according to claim 1, wherein said forming a plurality of circuit blocks further comprises:
   detecting an inverter that is connected to an external output terminal of said circuit to be analyzed;
   searching for another inverter that is connected to said detected inverter or a plurality of inverters that are connected in series to the detected inverter; and
   forming a new circuit block that is composed of said detected inverter and at least one inverter obtained by said search.

5. The delay characteristic analyzing method according to claim 1, wherein said forming a plurality of circuit blocks further comprises:
   detecting a unit cell including an inverter, the inverter having an input node and an output node both of which are connected to a single downstream unit cell; and
   coupling the detected unit cell to the downstream unit cell.

6. The delay characteristic analyzing method according to claim 1, wherein said forming a plurality of circuit blocks further comprises:
   detecting a unit cell or a circuit block having a plurality of input nodes to which signals that are expected to vary simultaneously are input; and
   forming a single circuit block by coupling the detected unit cell or circuit block to an immediately upstream unit cell or circuit block.

7. The delay characteristic analyzing method according to claim 1, wherein said forming a plurality of circuit blocks further comprises:
   receiving an instruction that specifies a unit cell; and
   forming preferentially a circuit block including the specified unit cell.

8. The delay characteristic analyzing method according to claim 1, wherein said forming the plurality of circuit blocks further comprises:
   receiving an instruction that specifies a unit cell;
   forming circuit blocks by excluding the specified unit cell;
   receiving an instruction that specifies a circuit block that is a destination the specified unit cell should be coupled to; and
   coupling the specified unit cell to the specified circuit block.

9. The delay characteristic analyzing method according to claim 1, wherein said performing of the electrical circuit simulation on each circuit block comprises:
   detecting a circuit block having a plurality of input nodes to which signals that are expected to vary simultaneously are inputted;
   generating a test vector including signals inputted to the input nodes having a statistically estimated phase difference; and
   performing an electrical circuit simulation on the detected circuit block, by using the generated test vector.

10. The delay characteristic analyzing method according to claim 1, wherein said performing of the electrical circuit simulation on each circuit block comprises:
    detecting a circuit block having a plurality of input nodes to which signals that are expected to vary simultaneously are inputted;
    receiving an instruction that specifies a phase difference to be given to input signals that are input to the input nodes;
    generating a test vector including signals inputted to the input nodes having the specified phase difference; and
    performing an electrical circuit simulation on the detected circuit block, by using the generated test vector.

11. The delay characteristic analyzing method according to claim 1, further comprising:
    selecting circuit blocks to be analyzed, in order from the circuit block closest to an external input terminal on the circuit to be analyzed and indicated by the net list;
    executing, for each of said selected circuit blocks, the operation of performing a dynamic timing analysis and the operation of registering an obtained delay characteristic the delay characteristic library; and
    performing the static timing analysis after delay characteristics of all the circuit blocks are registered in the delay characteristic library, wherein the operation of performing a dynamic timing analysis comprises the substeps of:
      judging whether it is expected that signals that are inputted to any of the input nodes of the selected circuit block vary simultaneously;
      estimating a phase difference between the inputted signals that are expected to vary simultaneously, by performing a static timing analysis on signal paths from the external input terminal to the input nodes of the selected circuit block, said static timing analysis based on delay characteristics that were obtained on circuit blocks ranging from the external input terminal to a circuit block that is provided immediately upstream of the selected circuit block when a result of the judgment is affirmative, instead of generating an ordinary test vector; and performing an electrical circuit simulation on the selected circuit block using a test vector including signals that give the estimated phase difference.

12. The delay characteristic analyzing method according to claim 1, wherein said performing of an electrical circuit simulation on each circuit block comprises:

detecting other circuit blocks that are connected to output nodes of the circuit block to be dynamic-timing analyzed; and performing the electrical circuit simulation on the circuit block to be analyzed, the circuit block to be analyzed being a part of an expanded circuit that also includes the detected circuit blocks.

13. The delay characteristic analyzing method according to claim 1, wherein said performing the dynamic timing analysis comprises:

detecting other circuit blocks that are connected to output nodes of the circuit block to be dynamic-timing analyzed;

performing a switch level simulation on each of the detected circuit blocks by using a proper test vector;

determining, for each of the detected circuit blocks, sets of input signals as a maximum loading simulation vector and a minimum loading simulation vector with which the number of transistors where a change of state occurs is largest and smallest, respectively, based on a result of the switch level simulation;

inputting the maximum loading simulation vectors to the respective detected circuit blocks as sets of input signals, in the case of determining a maximum delay of the circuit block to be analyzed;

inputting the minimum loading simulation vectors to the respective detected circuit blocks as sets of input signals, in the case of determining a minimum delay of the circuit block to be analyzed; and performing the electrical circuit simulation on the circuit block to be analyzed, the circuit block to be analyzed being a part of an electrical circuit that also includes the detected circuit blocks.

14. The delay characteristic analyzing method according to claim 1, further comprising:

selecting, as subjects to be analyzed, in order from the circuit block closest to an external input terminal on the circuit to be analyzed and indicated by the net list;

executing, for each of said selected circuit blocks, the operation of performing a dynamic timing analysis and the operation of registering an obtained delay characteristic in the delay characteristic library; and performing the transmission delay analysis after delay characteristics of all the circuit blocks are registered in the delay characteristic library, wherein said operation of performing a dynamic timing analysis comprises:

detecting upstream circuit blocks connected to input nodes on the circuit block to be analyzed;

performing an electrical circuit simulation on the circuit block to be analyzed by using approximated waveforms corresponding to the respective detected upstream circuit blocks as input signal waveforms that are input to the respective input nodes of the circuit block to be analyzed;

extracting a waveform having a maximum slew rate and a waveform having a minimum slew rate from output waveforms that are received as results of the electrical circuit simulation; and generating an approximated waveform that reflects features of the maximum slew rate waveform and the minimum slew rate waveform for each of the output nodes, and providing the generated approximated waveforms to be used in an electrical circuit simulation on a downstream circuit block.

15. The delay characteristic analyzing method according to claim 1, further comprising:

selecting, as subjects to be analyzed, in order from the circuit block closest to an external input terminal on the circuit to be analyzed and indicated by the net list;

executing, for each of said selected circuit blocks, the operation of performing a dynamic timing analysis and the operation of registering an obtained delay characteristic in the delay characteristic library; and performing the transmission delay analysis after delay characteristics of all the circuit blocks are registered in the delay characteristic library, wherein said operation of performing a dynamic timing analysis comprises:

reactivating the operation of performing a dynamic timing analysis to perform a dynamic timing analysis on a circuit block that is specified by an input instruction by excluding a specified test vector;

judging whether or not a remarkable variation has occurred in the delay characteristic due to the exclusion of the specified test vector, said judging based on a result of performing a dynamic timing analysis in accordance to said reactivation of the specified circuit block;

determining circuit blocks that are included in such a range that their delay characteristics are influenced by the variation in the delay characteristic of the specified circuit block, when a result of the judgment is affirmative;

reactivating the operation of performing the dynamic timing analysis on each of the circuit blocks included in the range; and reactivating the operation of generating the delay characteristic library according to the analysis results, by registering analysis results in the delay characteristic library, said analysis results being obtained on the specified block and on the circuit blocks included in the range, wherein said operation of performing a dynamic timing analysis comprises:

generating, by a proper method, a test vector to be input to input nodes of the circuit block to be analyzed;

searching for and detecting upstream circuit blocks that are connected to the input nodes of the circuit block to be analyzed;

performing an electrical circuit simulation on the circuit block to be analyzed by inputting an appropriate output signal waveform corresponding to a proper output node of the upstream circuit block to each input node of the circuit block to be analyzed, as input signal waveforms;

generating, for each of output nodes of the circuit block to be analyzed, an approximated waveform that reflects features of a waveform having a maximum slew rate and a waveform having a minimum slew rate that are included in output signals obtained by the electrical circuit simulation; and storing said approximated waveforms corresponding to the respective output nodes as output signal waveforms corresponding to the circuit block to be analyzed, for using the approximated waveforms as signals to be input to a downstream circuit block, wherein said judging operation judges that a remarkable variation has occurred in the delay characteristic when slew rates of not all output signal waveforms included in the analysis result obtained by the dynamic timing analysis on the specified circuit block are included in the range of all slew rates of the output signal waveforms stored in accordance to the specified circuit block.

16. The delay characteristic analyzing method according to claim 1, further comprising, before said operation of performing the dynamic timing analysis, the operations of:

receiving, for a predetermined net list that had been performed a delay analysis, data relating to respective circuit blocks that were dynamic timing analyzed and data indicating delay characteristics of the respective circuit blocks;

judging, for each circuit block formed on a newly read net list, whether the delay characteristic data obtained during the process of the delay analysis on the delay-characteristic analyzed net list is reusable or a new dynamic timing analysis needs to be performed, based on the data received for the delay-characteristic analyzed net list and data relating to the circuit blocks of the new net list;

performing a dynamic timing analysis and then generating a delay characteristic library on a new circuit block to be made a subject of the dynamic timing analyzing; and registering said obtained delay characteristic that has been judged usable and which corresponds to said circuit block on the newly read net list, as an element of the delay characteristic library of the newly read net list.

17. A delay analysis system comprising:

a reading section to read a net list that indicates an arrangement of and a connection between transistors and circuit elements equivalent to transistors;

a unit dividing section to divide a circuit to be analyzed, which is indicated by the net list, into unit cells each being a minimum of which can operate as a logic circuit;

a block forming section to form a plurality of circuit blocks by coupling together said unit cells according to a predetermined condition and the connection that is indicated by the net list;

a dynamic analyzing unit to analyze a dynamic characteristic of each of the circuit blocks by performing an electrical circuit simulation under a condition of inputting a combination of proper input signals to the circuit blocks;

a library generating section to generate a delay characteristic library by extracting a delay characteristic of each of the circuit blocks from results of said electrical circuit simulations on each of the circuit blocks and registering the extracted delay characteristic; and a transmission characteristic analyzing section to perform a transmission delay analysis on a desired signal path by performing a static timing analysis based on said delay characteristic library by considering the circuit to be analyzed, which is indicated by the net list, to be structured by the circuit blocks.

18. The delay analysis system according to claim 17, further comprising:

an analysis controlling section to control delay analysis by selecting, as subjects to be analyzed, in order from the circuit block closest to an external input terminal on the circuit to be analyzed and indicated by the net list, processing the selected circuit blocks at the dynamic analyzing unit, processing obtained analysis results one after another at the library generating section, and activating the transmission delay analyzing section after a delay characteristic library including delay characteristics of all the circuit blocks has been generated;

an activation controlling section to activate processing at the dynamic analyzing unit to perform a dynamic timing analysis on a circuit block that is specified by an input instruction by excluding a specified test vector;

a variation judging section to judge whether a remarkable variation has occurred in the delay characteristic due to the exclusion of the specified test vector, said judging based on an analysis result obtained by said activated processing at the dynamic analyzing unit;

a determining section to determine circuit blocks that are included in such a range that their delay characteristics are influenced by the variation in the delay characteristic of the specified circuit block, when a result of the judgment is affirmative;

an analysis activating section to activate processing at the dynamic analyzing unit on each of the circuit blocks included in the range; and a generation activating section to activate processing at the library generating section according to analysis results, by processing analysis results at the library generating section, said analysis results being obtained on the specified block and on the circuit blocks included in the range, wherein the dynamic analyzing unit comprises:

a vector generating section to generate, by a proper method, a test vector to be input to input nodes of the circuit block to be analyzed;

a block searching section to search for and detect upstream circuit blocks that are connected to the input nodes of the circuit block to be analyzed;

a simulation section to perform an electrical circuit simulation on the circuit block to be analyzed by inputting an appropriate output signal waveform corresponding to a proper output node of the upstream circuit block to each input node of the circuit block to be analyzed, as input signal waveforms;

a waveform approximating section to genarate, for each of output nodes of the circuit block to be analyzed, an approximated waveform that reflects features of a waveform having a maximum slew rate and a waveform having a minimum slew rate that are included in output signals obtained by the electrical circuit simulation; and an approximated waveform storing section to store the approximated waveforms corresponding to the respective output nodes as output signal waveforms corresponding to the circuit block to be analyzed, to use the approximated waveforms as signals to be input to a downstream circuit block, wherein the variation judging section judges that a remarkable variation has occurred in the delay characteristic when slew rates of not all output signal waveforms included in the analysis result obtained by the dynamic timing analysis on the specified circuit block are included in the range of all slew rates of the output signal waveforms stored in accordance to the specified circuit block in the approximated waveform storing section.

19. The delay analysis system according to claim 17, further comprising:

a data input section to input, to a predetermined net list that was performed delay analysis, various kinds of data including data indicating unit cells constituting each circuit block that was dynamic timing analyzed, data indicating other circuit blocks that are connected to each circuit block, and data indicating a delay characteristic of each circuit block;

a block judging section to judge, from among circuit blocks that have been formed on a net list newly read by the block forming section, an equivalent circuit block that is identical to any circuit block formed on the delay-characteristic analyzed net list and is connected to a circuit block identical to a circuit block connected to said identical circuit block formed on the delay-characteristic analyzed net list, said judging based on the data received from the data input section, and to perform processing of the dynamic analyzing unit and then the processing of the library generating section on the other circuit blocks as new circuit blocks; and an existing characteristic entry section to register a received delay characteristic, input according to the circuit block judged by the block judging section to be the equivalent circuit block, as an element of a delay characteristic library corresponding to the newly read net list.

* * * * *